(12) United States Patent
Kamijima

(10) Patent No.: US 6,780,738 B2
(45) Date of Patent: Aug. 24, 2004

(54) PATTERN FORMING METHOD, METHOD OF MAKING MICRODEVICE, METHOD OF MAKING THIN-FILM MAGNETIC HEAD, METHOD OF MAKING MAGNETIC HEAD SLIDER, METHOD OF MAKING MAGNETIC HEAD APPARATUS, AND METHOD OF MAKING MAGNETIC RECORDING AND REPRODUCING APPARATUS

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/409,046

(22) Filed: Apr. 9, 2003

(65) Prior Publication Data

US 2003/0200647 A1 Oct. 30, 2003

(30) Foreign Application Priority Data

Apr. 25, 2002 (JP) ........................................ 2002-124454

(51) Int. Cl.[7] .............................................. H01L 21/44
(52) U.S. Cl. ........................................... 438/579; 438/3
(58) Field of Search ......................... 438/579, 570–578, 438/800, 3

(56) References Cited

U.S. PATENT DOCUMENTS 3,853,715 A 12/1974 Romankiw
2003/0080088 A1 * 5/2003 Kagami et al. ............... 216/41

FOREIGN PATENT DOCUMENTS

JP   B2 56-36706   8/1981

* cited by examiner

Primary Examiner—Craig A. Thompson
(74) Attorney, Agent, or Firm—Oliff & Berridge, PLC

(57) ABSTRACT

All the electrode films corresponding to respective metal materials are laminated on a substrate beforehand, a first electrode film located farthest from the substrate is formed with a first metal pattern suitable for the first electrode film, and then the first electrode film is etched away so as to expose a second electrode film located lower than the first electrode film. Therefore, the second electrode film suitable for a metal material of a second metal pattern can selectively be plated, whereby the second metal pattern can be formed while optimizing the combination of its metal material and electrode film. Also, the second electrode film for the later step does not attach to the previously formed first metal pattern.

10 Claims, 22 Drawing Sheets

Fig.2
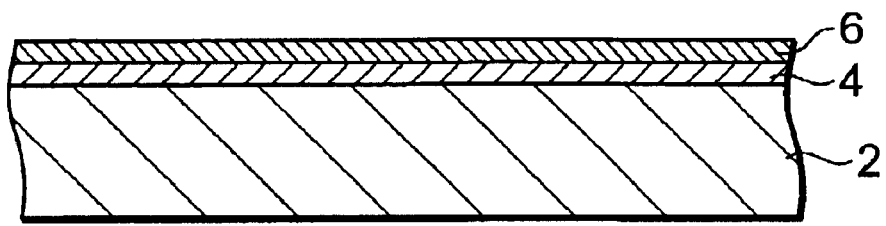
Fig.3
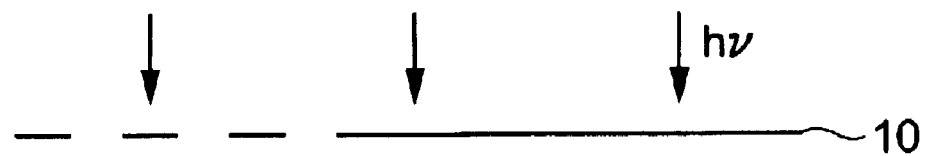
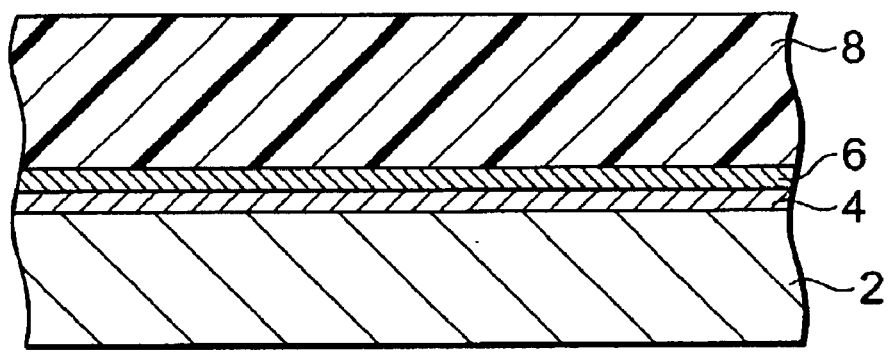

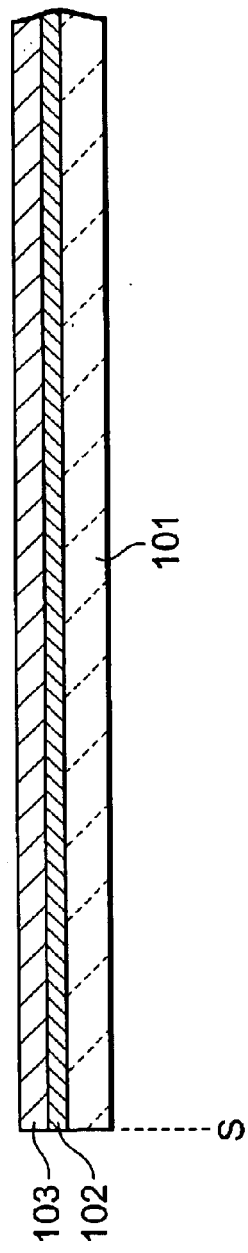

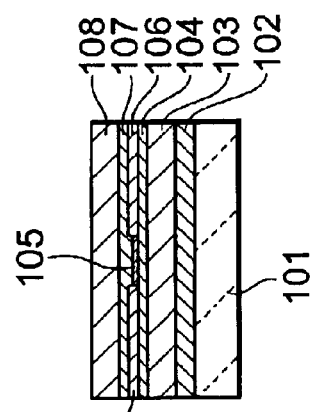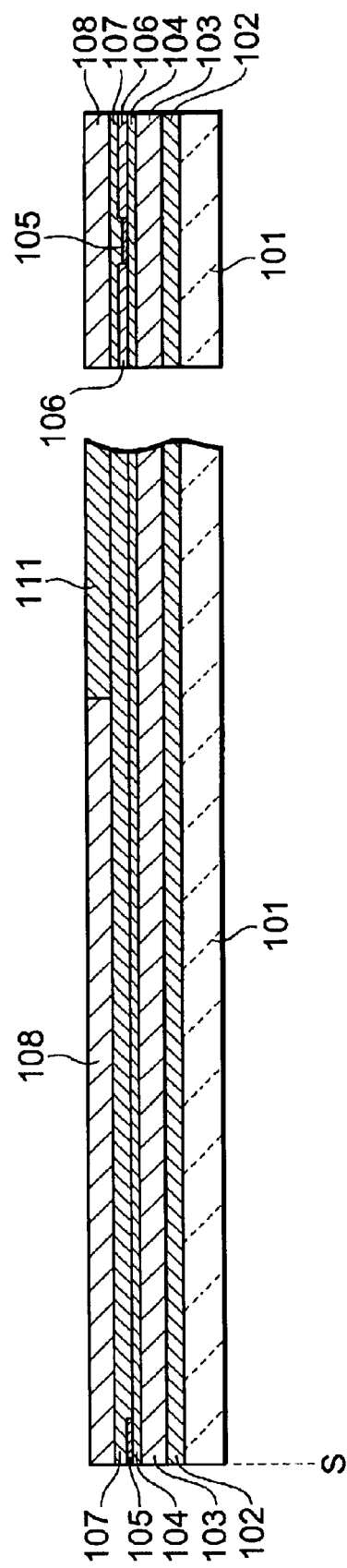

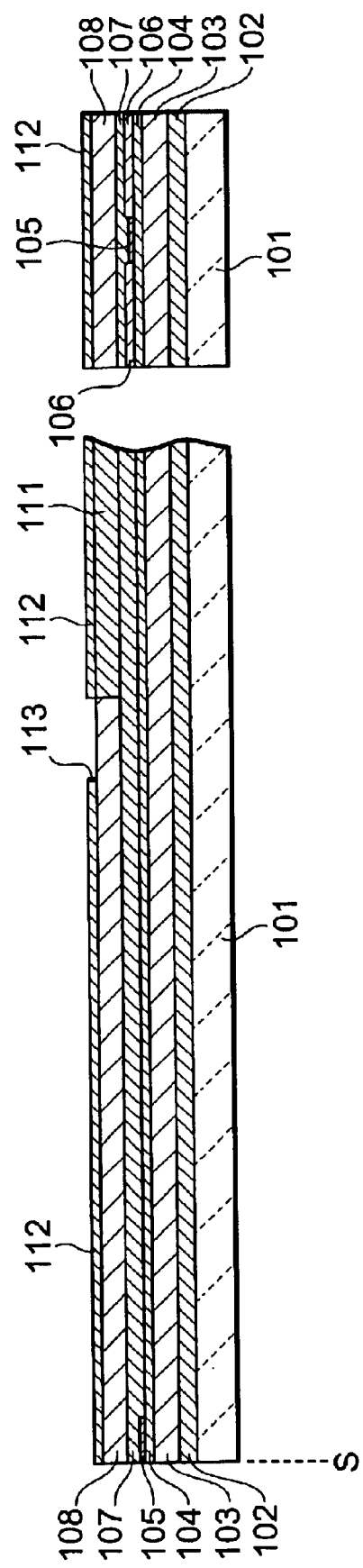

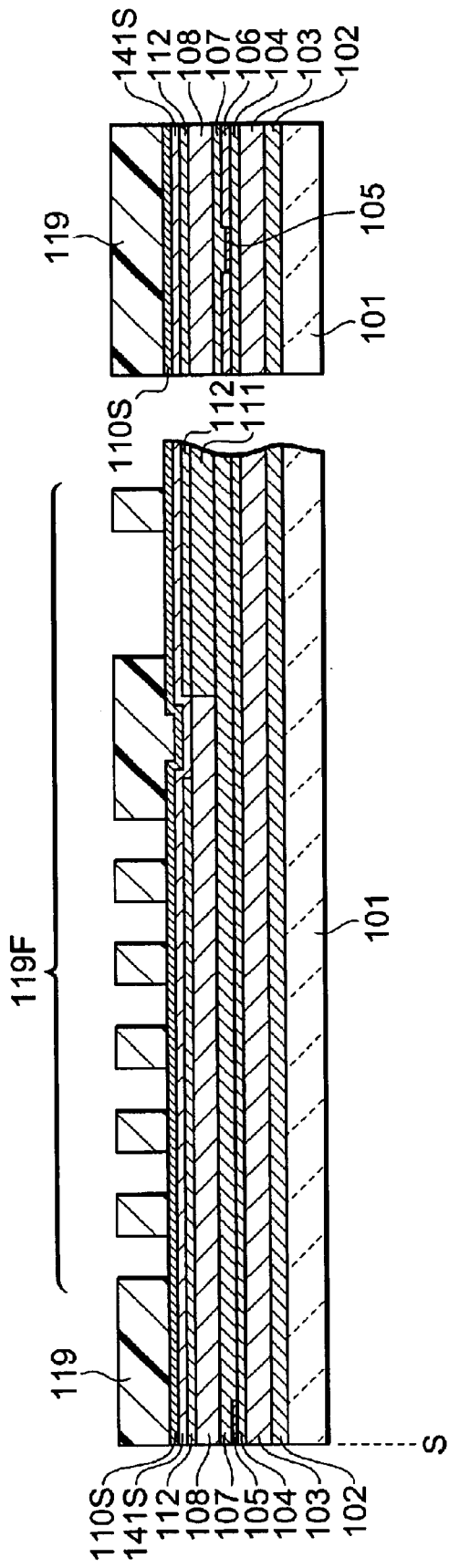

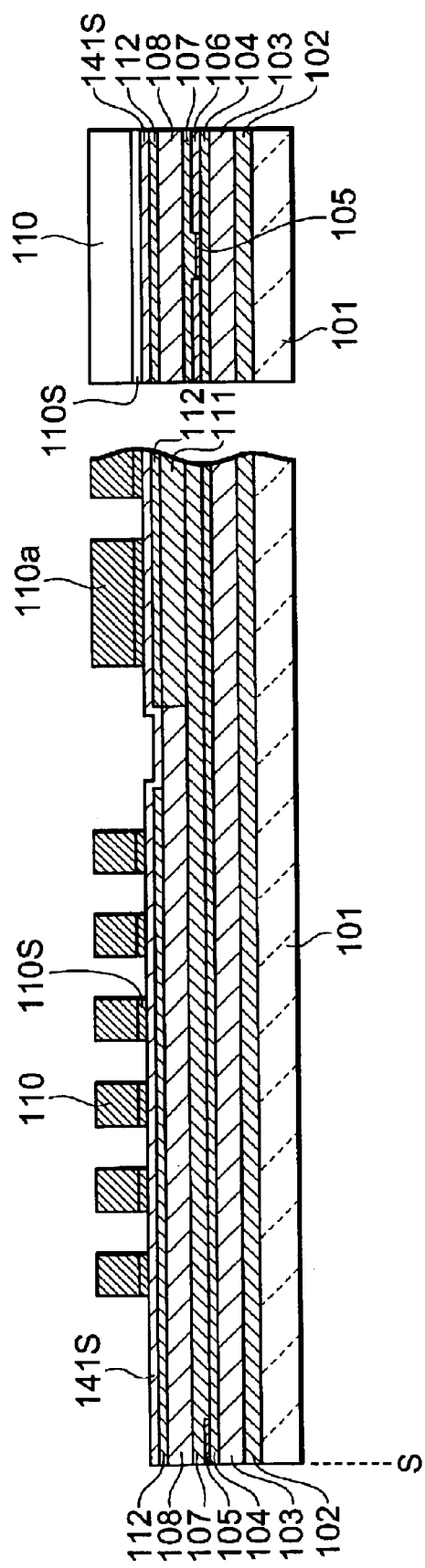

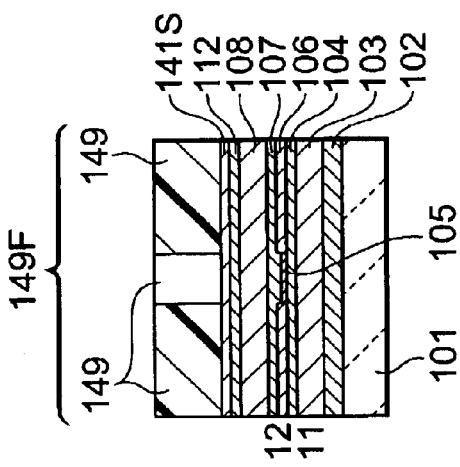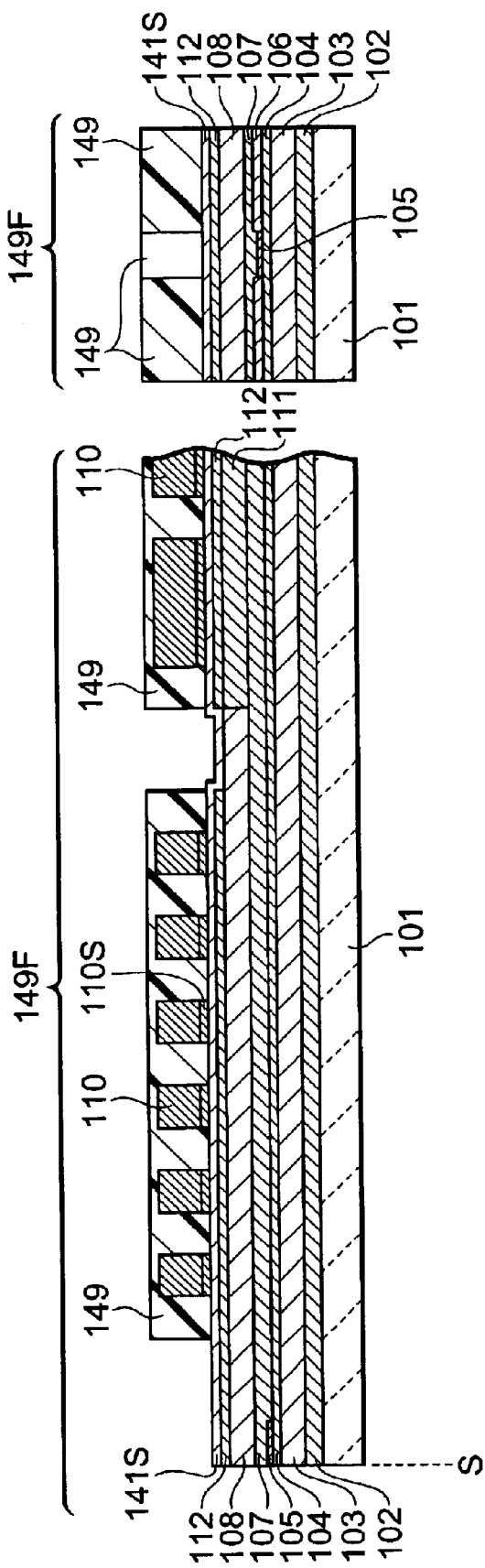

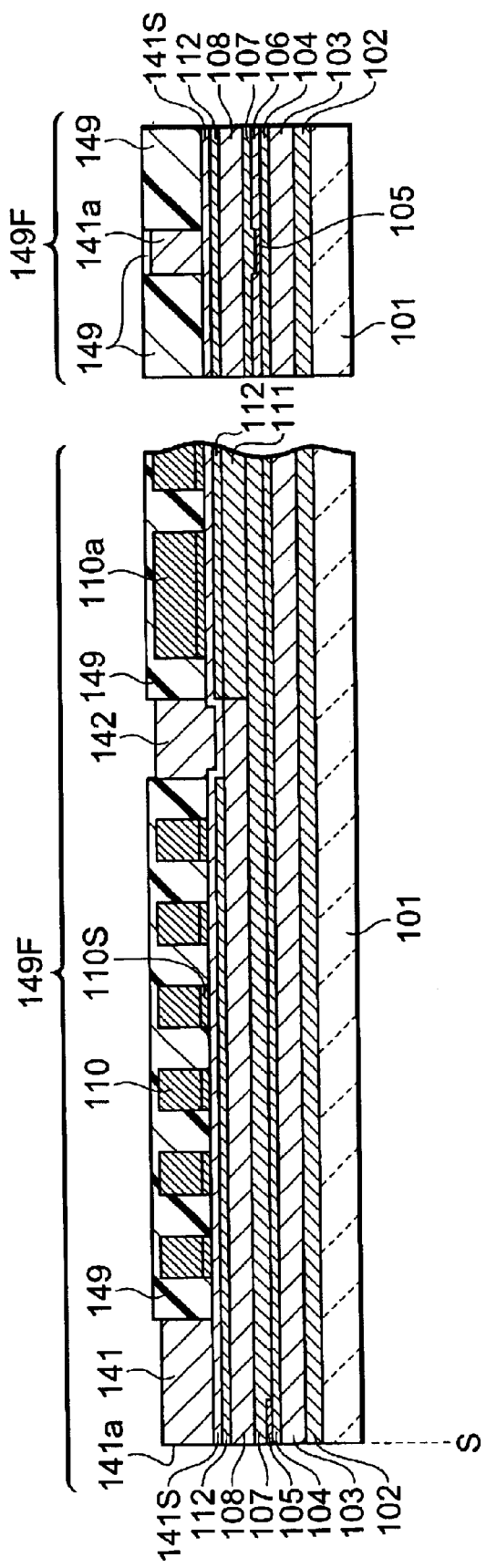

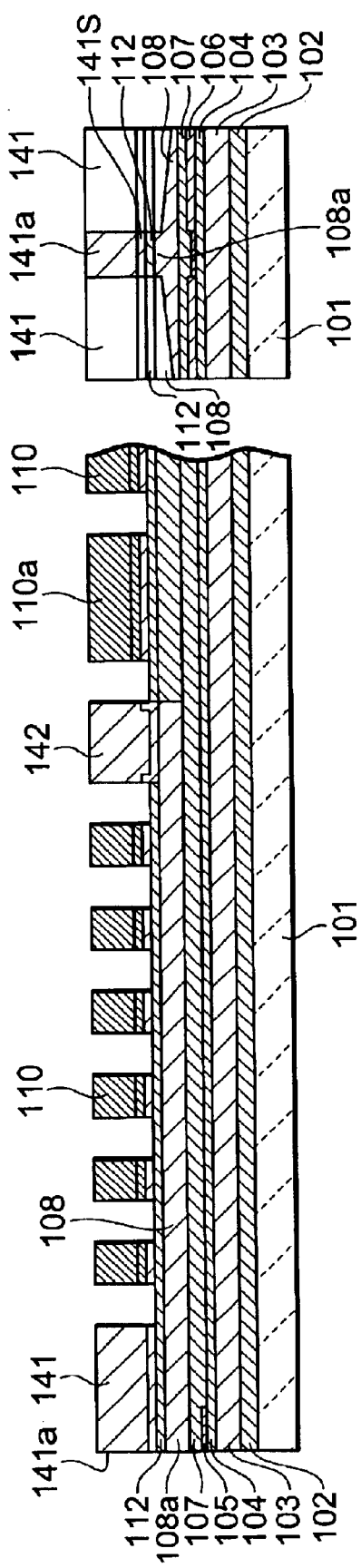

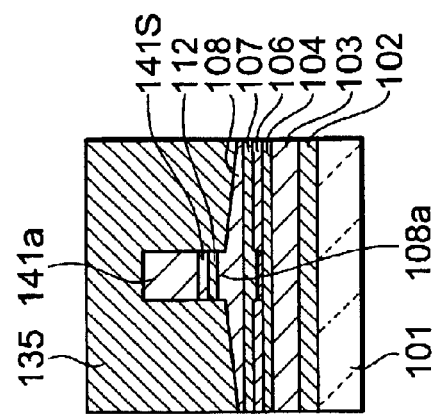
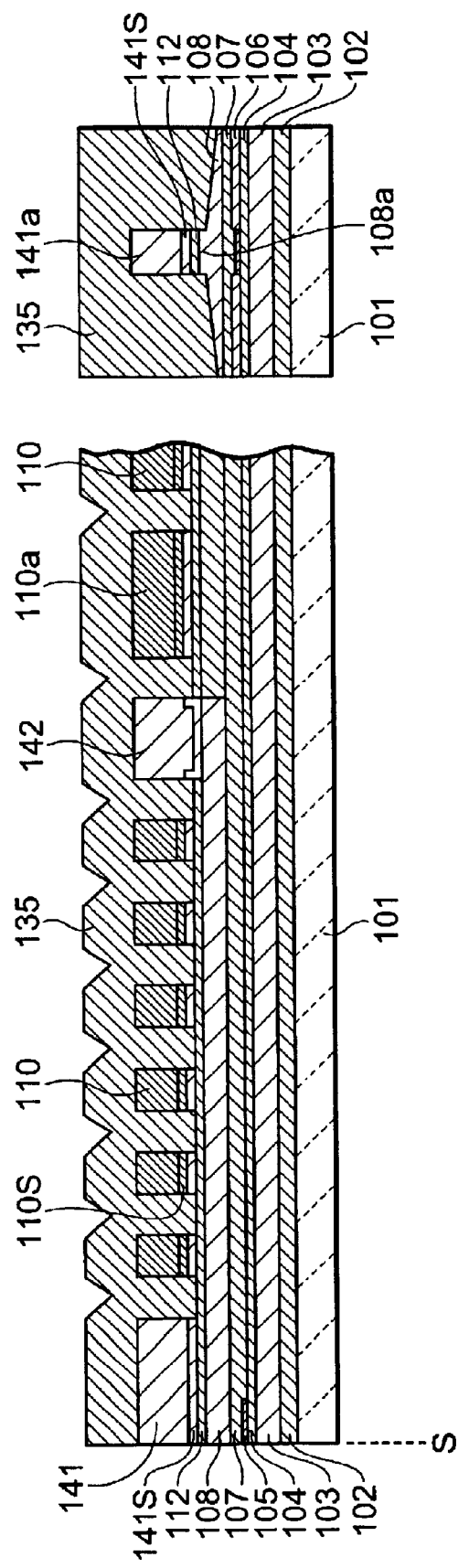
Fig.25A
Fig.25B

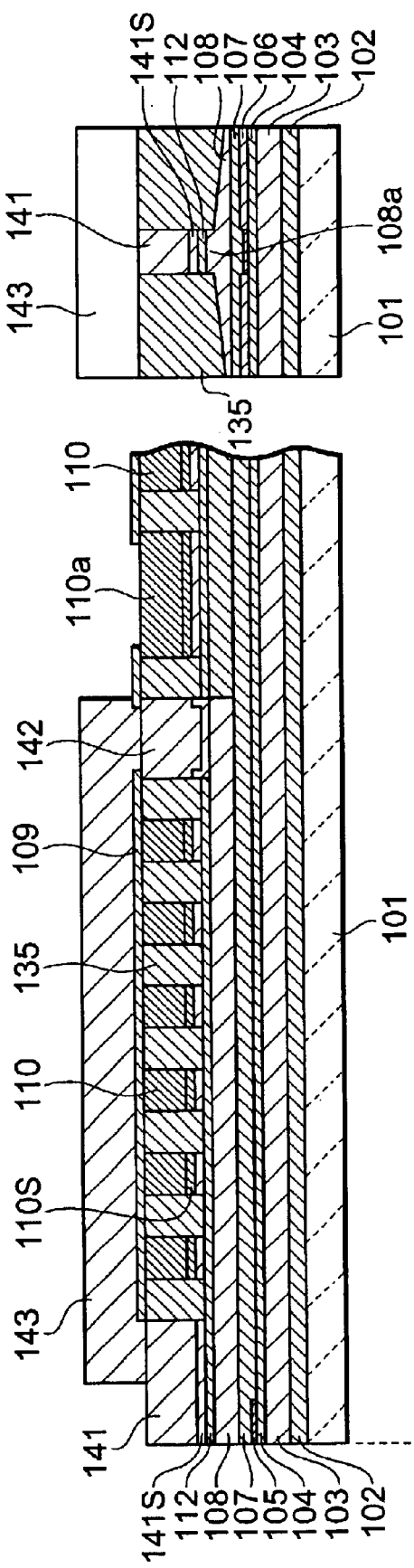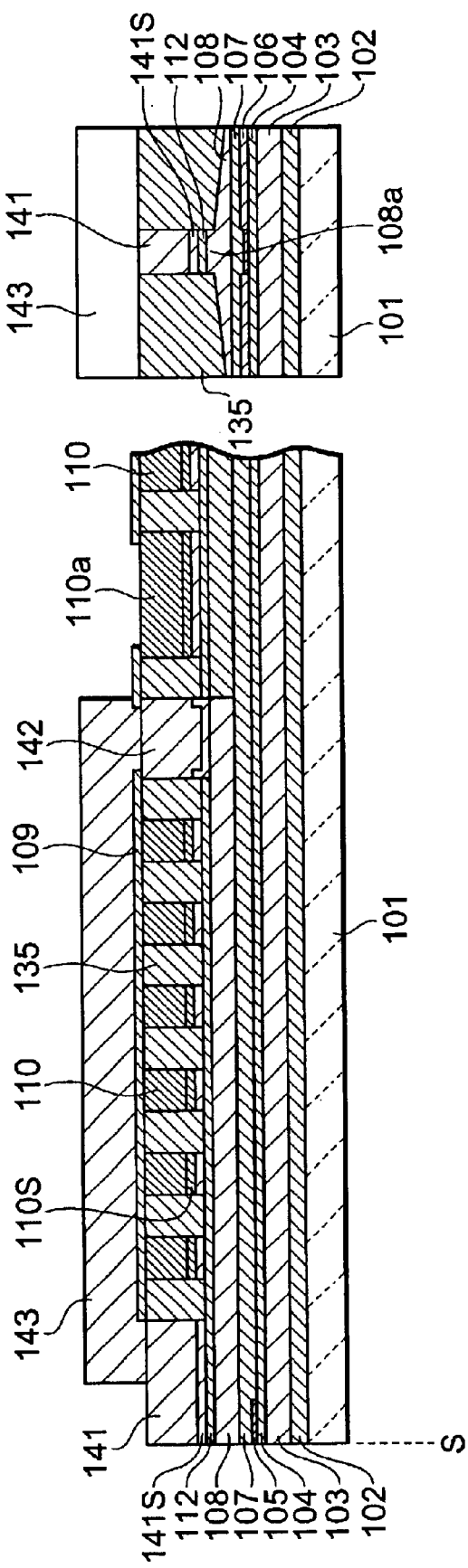

*Fig.27A*  *Fig.27B*
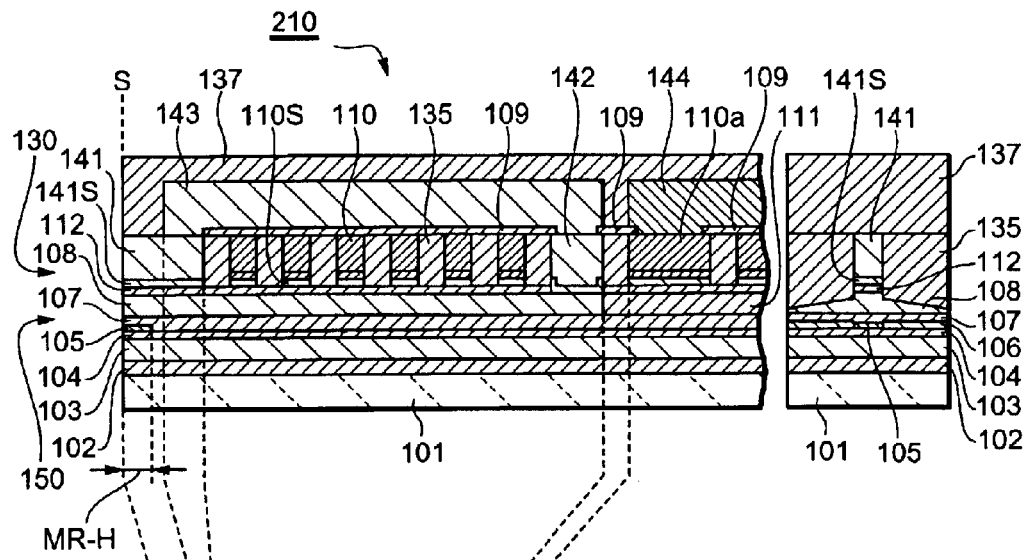
*Fig.27C*
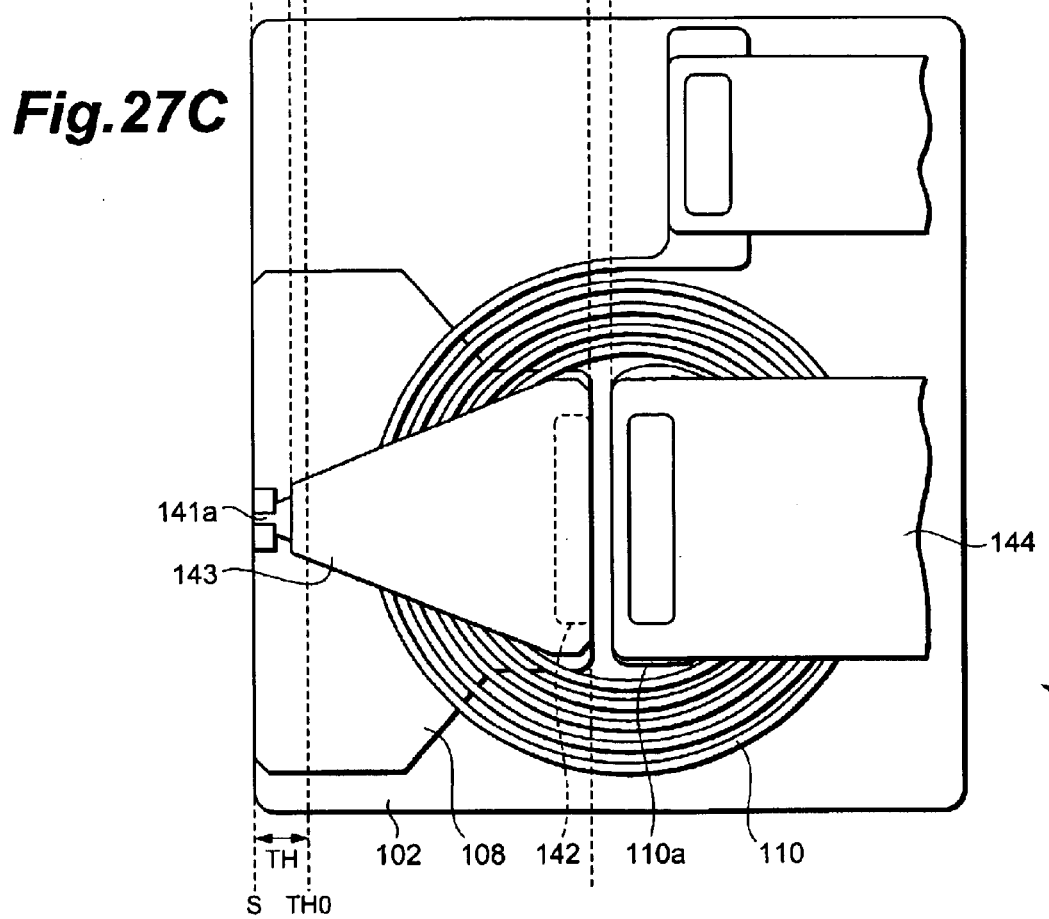

PATTERN FORMING METHOD, METHOD OF MAKING MICRODEVICE, METHOD OF MAKING THIN-FILM MAGNETIC HEAD, METHOD OF MAKING MAGNETIC HEAD SLIDER, METHOD OF MAKING MAGNETIC HEAD APPARATUS, AND METHOD OF MAKING MAGNETIC RECORDING AND REPRODUCING APPARATUS

BACKGROUND OF THE INVENTION

1. Field of the Invention

The present invention relates to a pattern forming method for forming a plurality of patterns made of respective metal materials different from each other on the same surface of a substrate, and a method of making a microdevice using the same. In the present invention, the microdevice encompasses thin-film magnetic heads, thin-film inductors, semiconductor devices, thin-film sensors, thin-film actuators, and apparatus incorporating them.

2. Related Background Art

Known as a method of forming a metal pattern on a substrate is so-called frame plating such as one disclosed in Japanese Examined Patent Publication No. SHO 56-36706, for example. This method comprises the steps of laminating an electrode film on a substrate, forming on the electrode film a resist frame exposing a desirable part of the electrode film therethrough, plating on the electrode film exposed through the resist frame a desirable metal layer while using the electrode film as an electrode, and forming a metal pattern on the substrate by removing the resist frame and the surplus of electrode film.

SUMMARY OF THE INVENTION

There are cases where such a frame plating method forms a plurality of patterns made of respective metal materials different from each other on the same surface of a substrate. Known as methods in such a case are one repeating for each metal material a series of steps of forming a resist frame, plating with a metal material, and removing the resist frame with respect to one kind of electrode film; and one repeating for each metal material a series of steps of forming an electrode film, forming a resist frame, plating with a metal material, and removing the resist frame and the surplus of electrode film.

When plating is repeated for each metal material with respect to one kind of electrode film as in the former, however, the combination of the electrode film and metal material is not always optimal, so that the state of film is hard to become favorable, whereby a metal pattern with a high adhesion may not be formed.

Though the combination of the electrode film and metal material can be optimized when all the steps from forming an electrode film to removing the same are repeated for each metal material as in the latter, an electrode film for the next metal material is laminated on the formed metal pattern, and thus must be completely removed in a later step. As a consequence, there have been cases where an electrode film material attaches to a side wall or the like of the formed metal pattern in particular, thereby becoming hard to remove, thus causing inconveniences.

In view of the problems mentioned above, it is an object of the present invention to provide a pattern forming method which can form a plurality of patterns made of respective metal materials different from each other with a high adhesion while restraining impurities from attaching thereto, a method of making a microdevice, a method of making a thin-film magnetic head, a method of making a magnetic head slider, a method of making a magnetic head apparatus, and a method of making a magnetic recording and reproducing apparatus.

The present invention provides a pattern forming method for forming a plurality of metal patterns made of respective metal materials different from each other on the same surface of a substrate, the method comprising an electrode film laminating step of laminating a plurality of electrode films corresponding to the respective metal materials on the substrate; a first pattern forming step of forming a first resist frame on a first electrode film located farthest from the substrate in the plurality of electrode films so as to expose a predetermined part of the first electrode film therethrough, plating the exposed part of the first electrode film with a metal material corresponding to the first electrode film so as to form a first metal pattern, and removing the first resist frame; a first electrode film removing step of etching the first electrode film away while using the first metal pattern as a mask so as to expose a second electrode film closer to the substrate than is the first electrode film; and a second pattern forming step of forming a second resist frame on the second electrode film so as to expose a predetermined part of the second electrode film therethrough, and plating the exposed part of the second electrode film with a metal material corresponding to the second electrode film so as to form a second metal pattern.

In the pattern forming method in accordance with the present invention, all the electrode films corresponding to respective metal materials forming desirable metal patterns are laminated on a substrate beforehand. Then, after the first metal pattern is formed by plating the first electrode film with a metal material suitable for the first electrode film, the first electrode film is etched away, so as to expose the second electrode film at the surface. Therefore, the second electrode film suitable for the metal material of the second metal pattern can selectively be plated, whereby the combination of each metal material and each electrode film can be optimized. Hence, the film quality of the plated metal pattern improves, so that the adhesion between the plated metal pattern and the electrode film can be enhanced.

Also, since all the electrode films are laminated on the substrate before forming metal patterns by plating, it is unnecessary for an electrode film for the next metal pattern to be formed on the substrate after one metal pattern is formed. Therefore, the electrode film for the next metal pattern does not attach to a metal pattern which has already been formed, whereby favorable metal patterns to which impurities attach less can be obtained.

Here, it is preferred that each of the metal materials and its corresponding electrode film be made of the same material.

When an electrode film and a material to be plated on the electrode film are made of the same material as such, metal ions and the like constituting the electrode film are prevented from dissolving from the electrode film into a plating solution of a plating bath and contaminating the plating solution and so forth during plating, whereby the metal pattern formed by plating is restrained from lowering its purity while adhesion is further improved between the metal material and electrode film.

The present invention provides a method of making a microdevice formed with a plurality of metal patterns made of respective metal materials different from each other on the same surface of a substrate, the method comprising an electrode film laminating step of laminating a plurality of electrode films corresponding to the respective metal materials on the substrate; a first pattern forming step of forming a first resist frame on a first electrode film located farthest from the substrate in the plurality of electrode films so as to expose a predetermined part of the first electrode film therethrough, plating the exposed part of the first electrode film with a metal material corresponding to the first electrode film so as to form a first metal pattern, and removing the first resist frame; a first electrode film removing step of etching the first electrode film away while using the first metal pattern as a mask so as to expose a second electrode film closer to the substrate than is the first electrode film; and a second pattern forming step of forming a second resist frame on the second electrode film so as to expose a predetermined part of the second electrode film therethrough, and plating the exposed part of the second electrode film with a metal material corresponding to the second electrode film so as to form a second metal pattern.

In the method of making a microdevice in accordance with the present invention, all the electrode films corresponding to respective metal materials forming desirable metal patterns are laminated on a substrate beforehand. Then, after the first metal pattern is formed by plating the first electrode film with a metal material suitable for the first electrode film, the first electrode film is etched away, so as to expose the second electrode film at the surface. Therefore, the second electrode film suitable for the metal material of the second metal pattern can selectively be plated, whereby the combination of each metal material and each electrode film can be optimized. Hence, the film quality of the plated metal pattern improves, so that the adhesion between the plated metal pattern and the electrode film can be enhanced.

Also, since all the electrode films are laminated on the substrate before forming metal patterns by plating, it is unnecessary for an electrode film for the next metal pattern to be formed on the substrate after one metal pattern is formed. Therefore, the electrode film for the next metal pattern does not attach to a metal pattern which has already been formed, whereby favorable metal patterns to which impurities attach less can be obtained.

Here, it is preferred that each of the metal materials and its corresponding electrode film be made of the same material.

When an electrode film and a material to be plated on the electrode film are made of the same material as such, metal ions and the like constituting the electrode film are prevented from dissolving from the electrode film into a plating solution of a plating bath and contaminating the plating solution and so forth during plating, whereby the metal pattern formed by plating is restrained from lowering its purity while adhesion is further improved between the metal material and electrode film.

The present invention provides a method of making a thin-film magnetic head formed with a plurality of metal patterns made of respective metal materials different from each other on the same surface of a substrate, the method comprising an electrode film laminating step of laminating a plurality of electrode films corresponding to the respective metal materials on the substrate; a first pattern forming step of forming a first resist frame on a first electrode film located farthest from the substrate in the plurality of electrode films so as to expose a predetermined part of the first electrode film therethrough, plating the exposed part of the first electrode film with a metal material corresponding to the first electrode film so as to form a first metal pattern, and removing the first resist frame; a first electrode film removing step of etching the first electrode film away while using the first metal pattern as a mask so as to expose a second electrode film closer to the substrate than is the first electrode film; and a second pattern forming step of forming a second resist frame on the second electrode film so as to expose a predetermined part of the second electrode film therethrough, and plating the exposed part of the second electrode film with a metal material corresponding to the second electrode film so as to form a second metal pattern.

In the method of making a thin-film magnetic head in accordance with the present invention, all the electrode films corresponding to respective metal materials forming desirable metal patterns are laminated on a substrate beforehand. Then, after the first metal pattern is formed by plating the first electrode film with a metal material suitable for the first electrode film, the first electrode film is etched away, so as to expose the second electrode film at the surface. Therefore, the second electrode film suitable for the metal material of the second metal pattern can selectively be plated, whereby the combination of each metal material and each electrode film can be optimized. Hence, the film quality of the plated metal pattern improves, so that the adhesion between the plated metal pattern and the electrode film can be enhanced.

Also, since all the electrode films are laminated on the substrate before forming metal patterns by plating, it is unnecessary for an electrode film for the next metal pattern to be formed on the substrate after one metal pattern is formed. Therefore, the electrode film for the next metal pattern does not attach to a metal pattern which has already been formed, whereby favorable metal patterns to which impurities attach less can be obtained.

Here, it is preferred that each of the metal materials and its corresponding electrode film be made of the same material.

When an electrode film and a material to be plated on the electrode film are made of the same material as such, metal ions and the like constituting the electrode film are prevented from dissolving from the electrode film into a plating solution of a plating bath and contaminating the plating solution and so forth during plating, whereby the metal pattern formed by plating is restrained from lowering its purity while adhesion is further improved between the metal material and electrode film.

Preferably, the thin-film magnetic head comprises a thin-film coil and a magnetic pole layer which are made of respective metal materials different from each other, the thin-film coil and magnetic pole layer being formed as the metal patterns. This yields a thin-film coil and a magnetic pole layer with favorable film quality, high adhesion, and less impurities.

The present invention provides a method of making a magnetic head slider equipped with a thin-film magnetic head, the method comprising the step of making the thin-film magnetic head by using the above-mentioned method of making the same.

The present invention provides a method of making a magnetic head apparatus including a thin-film magnetic head and a head supporting apparatus for supporting the thin-film magnetic head, the method comprising the step of making the thin-film magnetic head by using the above-mentioned method of making the same.

The present invention provides a method of making a magnetic recording and reproducing apparatus having a magnetic head apparatus including a thin-film magnetic head and a head supporting apparatus for supporting the thin-film magnetic head, and a magnetic recording medium for carrying out magnetic recording and reproducing in cooperation with the thin-film magnetic head, the method comprising the step of making the magnetic head apparatus by using the above-mentioned method of making the same.

In the methods of making a magnetic head slider, a magnetic head apparatus, and a magnetic recording and reproducing apparatus in accordance with the present invention, all the electrode films corresponding to respective metal materials forming desirable metal patterns are laminated on a substrate beforehand. Then, after the first metal pattern is formed by plating the first electrode film with a metal material suitable for the first electrode film, the first electrode film is etched away, so as to expose the second electrode film at the surface. Therefore, the second electrode film suitable for the metal material of the second metal pattern can selectively be plated, whereby the combination of each metal material and each electrode film can be optimized. Hence, the film quality of the plated metal pattern improves, so that the adhesion between the plated metal pattern and the electrode film can be enhanced.

Also, since all the electrode films are laminated on the substrate before forming metal patterns by plating, it is unnecessary for an electrode film for the next metal pattern to be formed on the substrate after one metal pattern is formed. Therefore, the electrode film for the next metal pattern does not attach to a metal pattern which has already been formed, whereby favorable metal patterns to which impurities attach less can be obtained.

When an electrode film and a material to be plated on the electrode film are made of the same material, metal ions and the like constituting the electrode film are prevented from dissolving from the electrode film into a plating solution of a plating bath and contaminating the plating solution and so forth during plating, whereby the metal pattern formed by plating is restrained from lowering its purity while adhesion is further improved between the metal material and electrode film.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2 is a view showing a state where first and second electrode films are laminated on a substrate;

FIG. 3 is a view showing a state coated with a resist and exposed to light;

FIG. 15A is a sectional view, taken along a plane perpendicular to both of a substrate and an air bearing surface, showing a state where an insulating layer and a lower shield layer are laminated on the substrate;

FIG. 15B is a sectional view, taken along a plane parallel to the air bearing surface near a magnetic pole, showing the state where the insulating layer and the lower shield layer are laminated on the substrate;

FIG. 16A is a view, taken along a plane perpendicular to both the substrate and air bearing surface, showing a state where a reproducing head section is formed on the substrate;

FIG. 16B is a sectional view, taken along a plane parallel to the air bearing surface near the magnetic pole, showing the state where the reproducing head section is formed on the substrate;

FIG. 17A is a view, taken along a plane perpendicular to both the substrate and air bearing surface, showing a state where a recording gap layer is formed on the substrate;

FIG. 17B is a sectional view, taken along a plane parallel to the air bearing surface near the magnetic pole, showing the state where the recording gap layer is formed on the substrate;

FIG. 18A is a view, taken along a plane perpendicular to both the substrate and air bearing surface, showing a state where first and second electrode films are laminated on the substrate and a resist is applied thereto so as to form a first resist frame;

FIG. 18B is a sectional view, taken along a plane parallel to the air bearing surface near the magnetic pole, showing the state where the first and second electrode films are laminated on the substrate and the resist is applied thereto so as to form the first resist frame;

FIG. 20A is a view, taken along a plane perpendicular to both the substrate and air bearing surface, showing a state where the first resist frame is removed and the first electrode film is etched away while using the thin-film coil as a mask;

FIG. 20B is a sectional view, taken along a plane parallel to the air bearing surface near the magnetic pole, showing the state where the first resist frame is removed and the first electrode film is etched away while using the thin-film coil as a mask;

FIG. 21A is a view, taken along a plane perpendicular to both the substrate and air bearing surface, showing a state where a resist is applied onto the second electrode film and thin-film coil so as to form a second resist frame;

FIG. 21B is a sectional view, taken along a plane parallel to the air bearing surface near the magnetic pole, showing the state where a resist is applied onto the second electrode film and thin-film coil so as to form the second resist frame;

FIG. 22A is a view, taken along a plane perpendicular to both the substrate and air bearing surface, showing a state where an upper magnetic pole layer and a magnetic layer are plated on the second electrode film;

FIG. 22B is a sectional view, taken along a plane parallel to the air bearing surface near the magnetic pole, showing the state where the upper magnetic pole layer and the magnetic layer are plated on the second electrode film;

FIG. 24A is a view, taken along a plane perpendicular to both the substrate and air bearing surface, showing a state where the recording gap layer and lower magnetic layer are etched into a trimmed form on the magnetic pole side;

FIG. 24B is a sectional view, taken along a plane parallel to the air bearing surface near the magnetic pole, showing the state where the recording gap layer and lower magnetic layer are etched into the trimmed form on the magnetic pole side;

FIG. 25A is a view, taken along a plane perpendicular to both the substrate and air bearing surface, showing a state where an insulating film is formed in order to make insulating layers between coil spacings;

FIG. 25B is a sectional view, taken along a plane parallel to the air bearing surface near the magnetic pole, showing the state where the insulating film is formed in order to make the insulating layers between coil spacings;

FIG. 26A is a view, taken along a plane perpendicular to both the substrate and air bearing surface, showing a state where the insulating layers are flattened while an insulating film and a yoke part layer are formed;

FIG. 26B is a sectional view, taken along a plane parallel to the air bearing surface near the magnetic pole, showing the state where the insulating layers are flattened while the insulating film and yoke part layer are formed;

FIG. 27A is a sectional view, taken along a plane perpendicular to both the substrate and air bearing surface, showing a state formed with a routing lead and coated with an overcoat layer;

FIG. 27B is a sectional view, taken along a plane parallel to the air bearing surface near the magnetic pole, showing the state formed with the routing lead and coated with the overcoat layer; and FIG. 27C is a top plan view, free of the insulating layers and the like, showing the state formed with the routing lead and coated with the overcoat layer.

DESCRIPTION OF THE PREFERRED EMBODIMENTS

In the following, preferred embodiments of the present invention will be explained in detail with reference to the accompanying drawings. In the explanation of the drawings, constituents identical or equivalent to each other will be referred to with numerals identical to each other without repeating their overlapping descriptions. For easier understanding, the drawings are partly exaggerated, so that proportions of dimensions and the like are not always constant among the drawings.

First Embodiment

Figure 1:
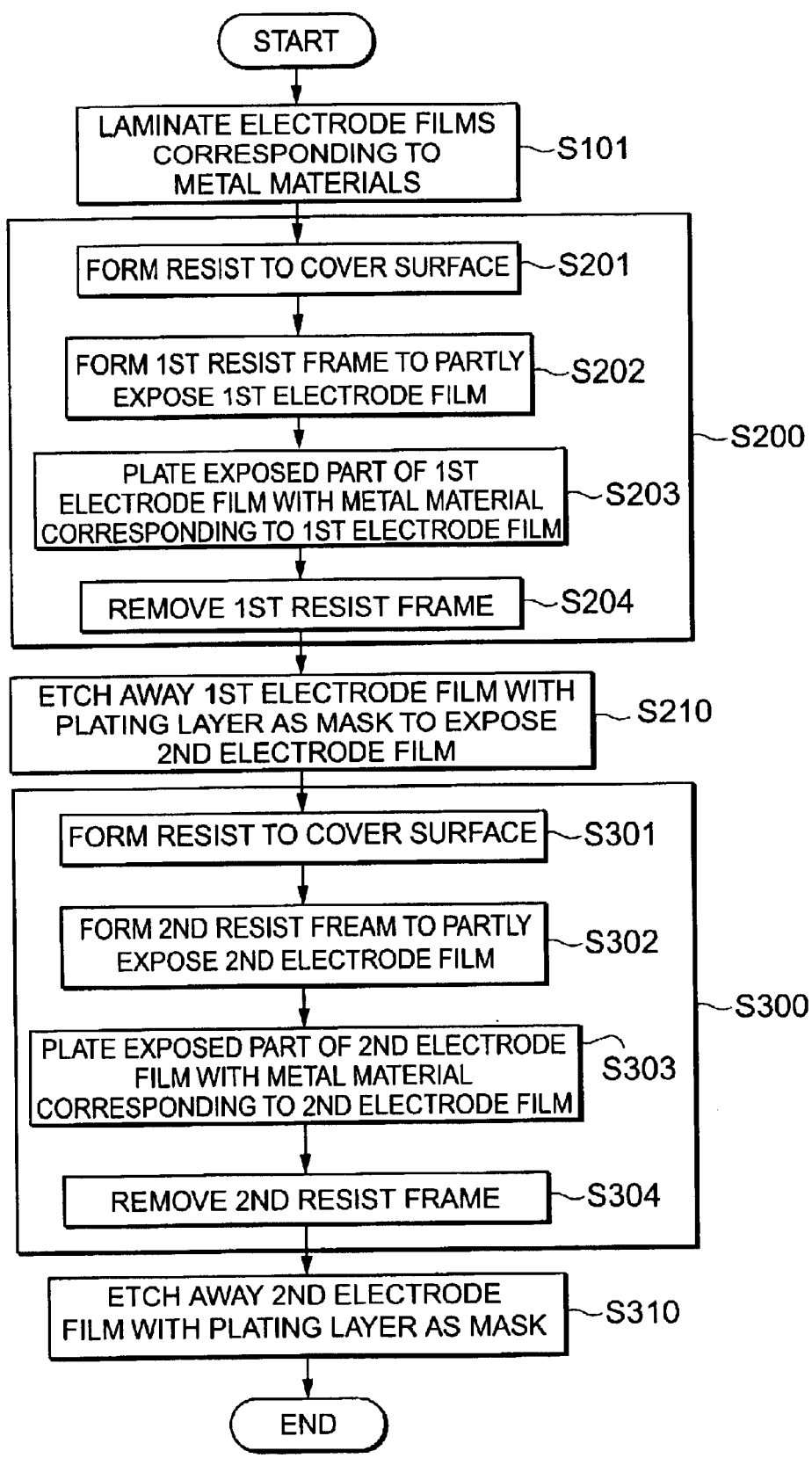
FIG. 1 is a flowchart showing the pattern forming method in accordance with a first embodiment.

To begin with, the pattern forming method in accordance with a first embodiment will be explained. FIG. 1 is a flowchart showing the pattern forming method in accordance with this embodiment, whereas FIGS. 2 to 11 are sectional views for explaining the pattern forming method in accordance with this embodiment.

In this embodiment, first and second metal patterns made of respective metal materials different from each other are formed on the same surface of a substrate by frame plating.

First, as shown in FIG. 2, a substrate 2 is prepared, and a second electrode film 4 made of the same material as that of the second metal pattern and a first electrode film 6 made of the same material as that of the first metal pattern are successively laminated on the substrate 2 (step 101). Sputtering and the like, for example, can be used for forming these electrode films.

Subsequently, the first metal pattern is formed by the following process (step 200):

First, as shown in FIG. 3, a resist 8 is applied onto the first electrode film 6, which is the topmost electrode film (step 201). Here, the resist 8 may be heat-treated as necessary.

Figure 4:
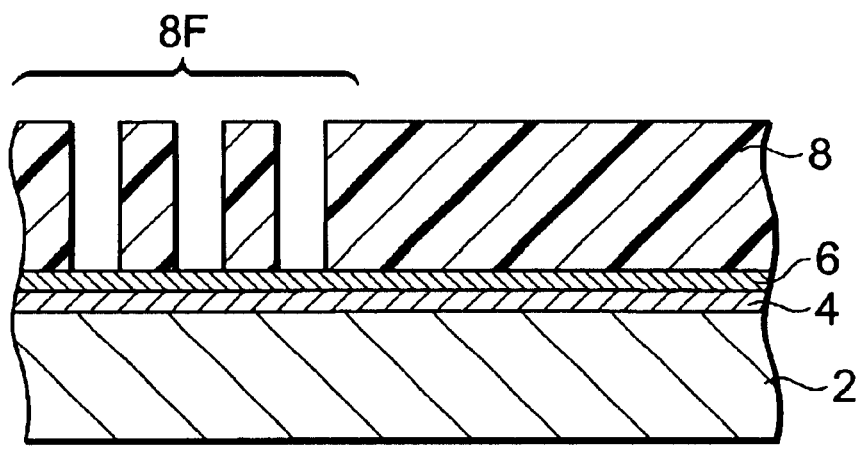
FIG. 4 is a view showing a state where the resist is developed so as to form a first resist frame.

Subsequently, the resist 8 is exposed to light by way of a mask 10 corresponding to the first metal pattern, so as to transfer a latent image of a pattern corresponding to the first metal pattern to the resist 8. Then, the resist 8 having the latent image transferred thereto is developed, washed with water, and dried, so as to form a first resist frame 8F which partly exposes the surface of the first electrode film 6 in conformity to the first metal pattern as shown in FIG. 4 (step 202). Here, the resist 8 may be heat-treated as necessary before the development after the transfer.

Figure 5:
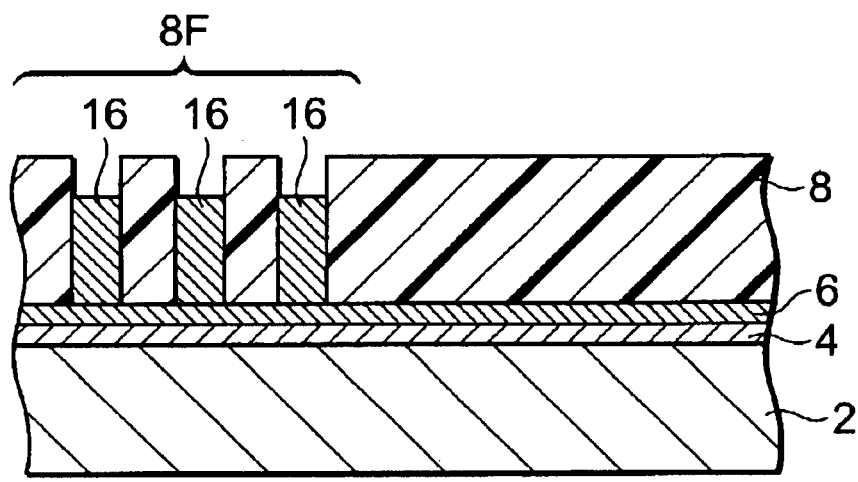
FIG. 5 is a view showing a state where a first metal material is plated on the first electrode film so as to form a first metal pattern.

Thereafter, as shown in FIG. 5, the first metal material is plated on the surface of the first electrode film 6 surrounded by the first resist frame 8F while using the first electrode film 6 as an electrode, so as to form a first metal pattern 16 (step 203). Here, the exposed surface of the first electrode film 6 may be pretreated with an acid and the like as necessary before plating.

Figure 6:
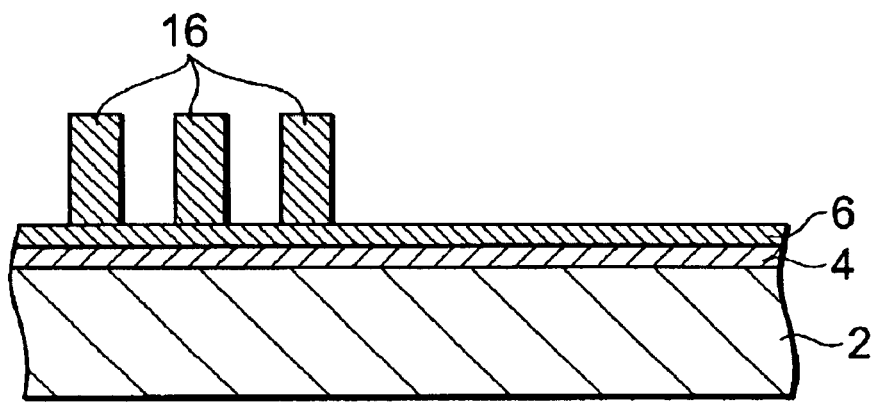
FIG. 6 is a view showing a state where the first resist frame is removed.

Next, as shown in FIG. 6, the first resist frame 8F is removed (step 204). Here, the first resist frame 8F can be removed by dissolution with an organic solvent, ashing, and the like, for example.

Figure 7:
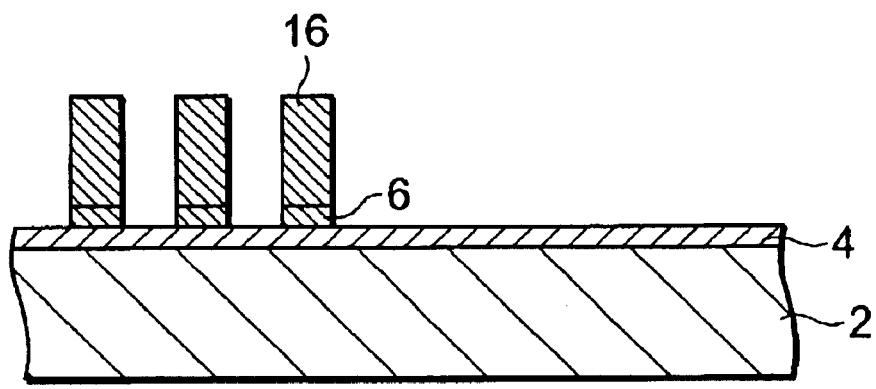
FIG. 7 is a view showing a state where the first electrode film is etched away while using the first metal pattern as a mask so as to expose the second electrode film.

Subsequently, as shown in FIG. 7, the part of first electrode film 6 exposed to the surface is etched away while using the first metal pattern 16 as a mask (step 210). At this time, the second electrode film 4 under the first electrode film 6 is exposed to the surface without being etched away.

Milling, dry-etching such as reactive ion etching, and wet etching can be employed for etching the first electrode film 6 away.

Figure 8:
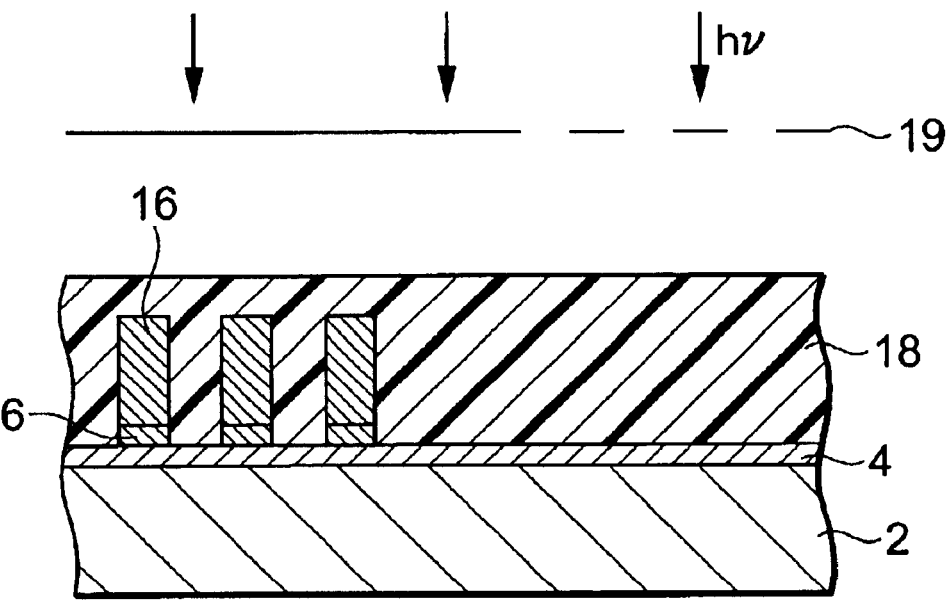
FIG. 8 is a view showing a state coated with a resist and exposed to light.

Thereafter, the second metal pattern is formed by the following process (step 300):

First, as shown in FIG. 8, a resist 18 is applied so as to cover the first metal pattern 16, second electrode film 4, and first electrode film 6 (step 301) as in step 201. Here, the resist 18 may be heat-treated as necessary.

Figure 9:
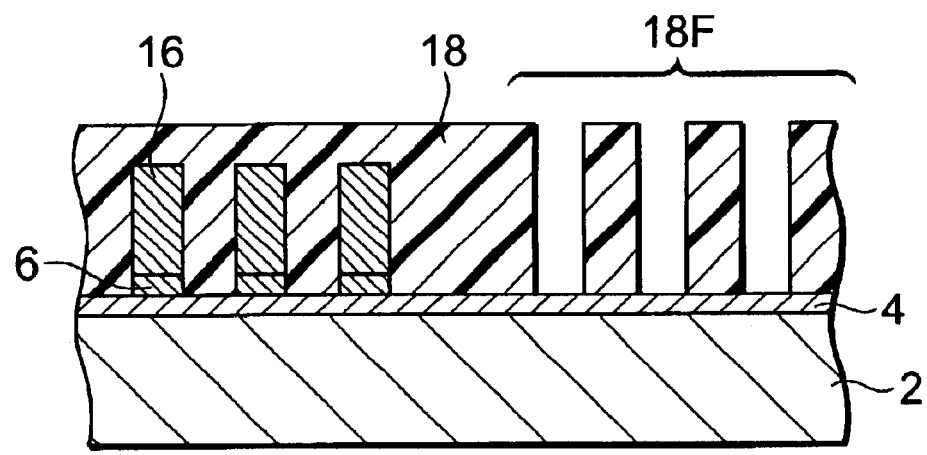
FIG. 9 is a view showing a state where the resist is developed so as to form a second resist frame.

Subsequently, a mask 19 corresponding to the second metal pattern is prepared, and the resist 18 is exposed to light so as to transfer a latent image of the mask to the resist 18 as instep 202. Then, as shown in FIG. 9, the resist 18 is developed, washed with water, and dried, so as to form a second resist frame 18F which exposes the surface of the second electrode film 4 in conformity to the second metal material pattern (step 302). Here, the resist 18 may be heat-treated as necessary before the development after the transfer.

Figure 10:
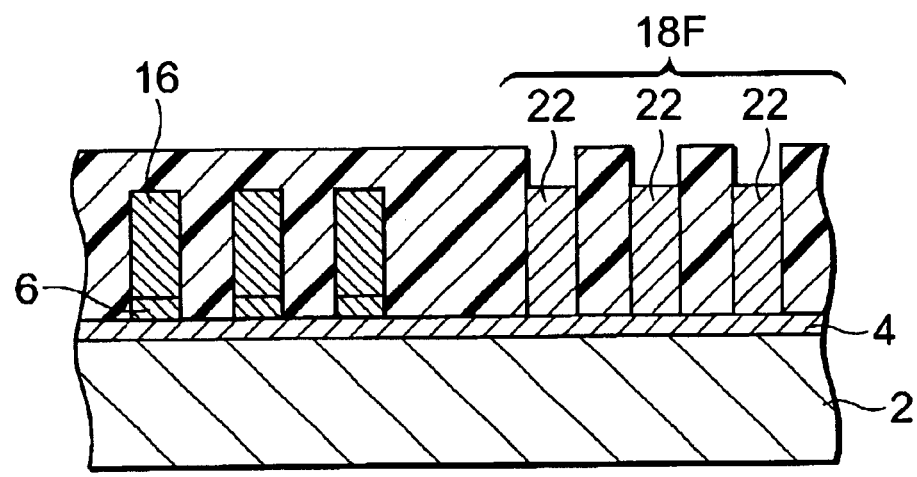
FIG. 10 is a view showing a state where a second metal material is plated on the second electrode film so as to form a second metal pattern.

Thereafter, as shown in FIG. 10, the part of second electrode film 4 exposed through the second resist frame 18F is plated with the second metal material while using the second electrode film 4 as an electrode, so as to form a second metal pattern 22 (step 303). Here, the exposed surface of the second electrode film 4 may be pretreated with an acid and the like as necessary before plating.

Figure 11:
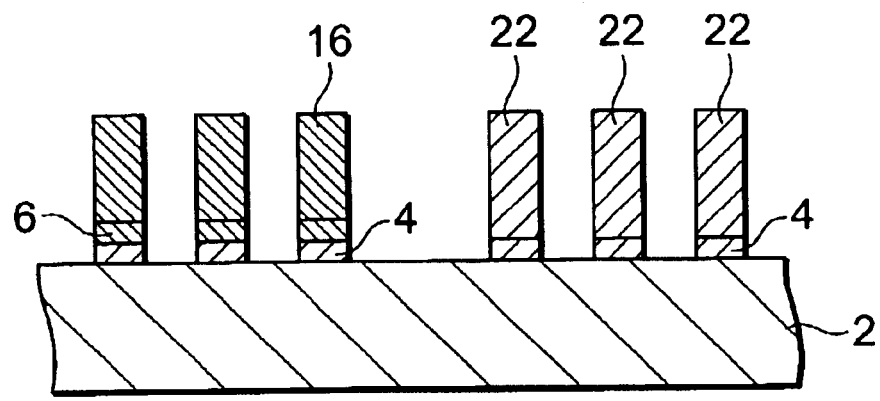
FIG. 11 is a view showing a state where the second resist frame is removed and the second electrode film is etched away while using the first and second metal patterns as a mask, so as to accomplish the first and second metal patterns on the substrate.

Finally, as shown in FIG. 11, the second resist frame 18F is removed (step 304) as in step 204, and the second electrode film 4 is etched away while using the first metal pattern 16 and second metal pattern 22 as a mask, for example, by milling or the like (step 310) as in step 210. This completes the pattern forming method of this embodiment.

In such a pattern forming method, both of the first electrode film 6 corresponding to the first metal pattern 16 and the second electrode film 4 corresponding to the second metal pattern 22 are laminated on the substrate 2 beforehand. After the first electrode film 6, which is the top layer located farthest from the substrate 2, is plated with the first metal material suitable therefor, so as to form the first metal pattern 16, the first electrode film 6 is etched away, whereby the second electrode film 4 on the lower layer side closer to the substrate 2 than is the first electrode film 6 is exposed to the surface. Therefore, the newly exposed second electrode film 4 can be plated with the second metal material suitable for the second electrode film 4, so as to form the second metal pattern 22. Since plating can be carried out while choosing the second electrode film 4 suitable for the second metal material relating to the second metal pattern 22 as such, the combination of each metal material and its electrode film can be optimized. As a consequence, the plated metal pattern improves its film quality, whereby adhesion can be enhanced between the plated metal pattern and the electrode film.

Before forming the first metal pattern 16 and second metal pattern 22 by plating, all the electrode films are laminated on the substrate 2, which makes it unnecessary to form the second electrode film 4 for the second metal pattern 22 on the substrate 2 after forming the first metal pattern 16. As a consequence, the second electrode film 4 for the second metal pattern 22 does not attach to the formed first metal pattern 16, whereby a favorable pattern to which impurities attach less can be obtained.

Further, since each metal material and its corresponding electrode film are made of the same material, metal ions and the like constituting the electrode film are prevented from dissolving from the electrode film into a plating solution of a plating bath and contaminating the plating solution and so forth during plating, whereby the metal pattern formed by plating is restrained from lowering its purity while adhesion is further improved between the metal material and electrode film.

Metal patterns were formed as an example of the pattern forming method in accordance with this embodiment as follows:

Here, a copper (Cu) pattern as the first metal pattern and a permalloy (NiFe) pattern as the second metal pattern were formed on the same surface of an AlTiC ($Al_2O_3.TiC$) substrate having a diameter of 3 inches and a thickness of about 2 mm.

Namely, a permalloy electrode film as the second electrode film was initially formed with a thickness of about 50 nm on the substrate, and then a copper electrode film as the first electrode film was formed with a thickness of about 100 nm thereon. Sputtering was employed for forming the permalloy electrode film and copper electrode film, while using SPF-740H (DC sputtering system) manufactured by ANELVA Corporation with a permalloy target or copper target, a power of 1000 W, an argon gas flow rate of 50 $cm^3$/min (standard state), and a pressure of 0.27 Pa.

Then, AZP4620 manufactured by Clariant was applied as a resist. Here, the resist was applied with a film thickness of about 3 $\mu$m by spin coating and prebaked at 110° C. for about 180 seconds on a hot plate or the like.

Thereafter, using a mask 10 having a repeated line/space pattern with dark and clear parts each having a width of 1 $\mu$m, the resist was exposed to light and developed, so as to form a resist frame.

Employed as the exposure apparatus here was NSR-TFHi12 manufactured by Nikon Corporation with an NA (numerical aperture) of 0.4, σ(ratio of illumination system NA/lens NA) of 0.4, wavelength of 3.5 nm, dose of 600 mJ/$cm^2$, and focal point of 0 $\mu$m.

The development was carried out by a puddle process three times each for 50 seconds with 2.38% TMAH (tetramethylammonium hydroxide) aqueous solution. After the development, the resist was washed with water, and then dried.

Subsequently, copper was plated on the copper electrode film, so as to form a copper pattern. Here, liquid bath plating with a copper sulfate bath was used for copper plating with a plating thickness of about 2.5 $\mu$m.

Then, the substrate was immersed into acetone and swung therein, so as to dissolve and remove the resist frame.

Thereafter, the copper pattern was etched away by milling while using the copper pattern as a mask, so as to expose the permalloy electrode film. For removing the copper electrode film, milling apparatus 8C manufactured by Commonwealth Scientific Corporation was used with a power of 500 W, a current of 500 mA, a pressure of 0.4 Pa, and an angle of 10°.

Next, the resist was applied as mentioned above, and the resist was exposed to light and developed as mentioned above, so as to form a resist frame. Here, an isolated line pattern with a clear part space width of 1 $\mu$m was used as a mask.

Subsequently, permalloy was plated on the permalloy electrode film, so as to form a permalloy pattern. For plating permalloy, a Watt's bath of Ni doped with Fe ion was utilized, so as to yield a plating thickness of about 2.5 $\mu$m.

Then, the resist was removed as mentioned above, and the permalloy electrode film was etched away as mentioned above.

The specific resistance of the copper pattern obtained by this example was on a par with that of a copper pattern simply formed alone on a copper electrode film, whereby it was verified that the copper pattern firmly adhered to the electrode layer. When the composition of the copper pattern was analyzed with an EDX (fluorescent X-ray microanalyzer) attached to scanning electron microscope S-4700 manufactured by Hitachi, Ltd., no impurities such as iron and nickel were detected. The film quality of copper pattern was favorable as well.

Also, in the permalloy pattern obtained by this embodiment, no deterioration in soft magnetic characteristics, no decrease in saturation flux density, and the like were seen, whereas no impurities such as copper was detected by component analyses, whereby it was verified that a permalloy pattern with a high adhesion and a high purity was obtained. The film quality of permalloy pattern was favorable as well.

Second Embodiment

The pattern forming method in accordance with a second embodiment will now be explained together with methods of making a thin-film magnetic head, a magnetic head slider, a magnetic head apparatus, and a magnetic recording and reproducing apparatus as microdevices.

Figure 12:
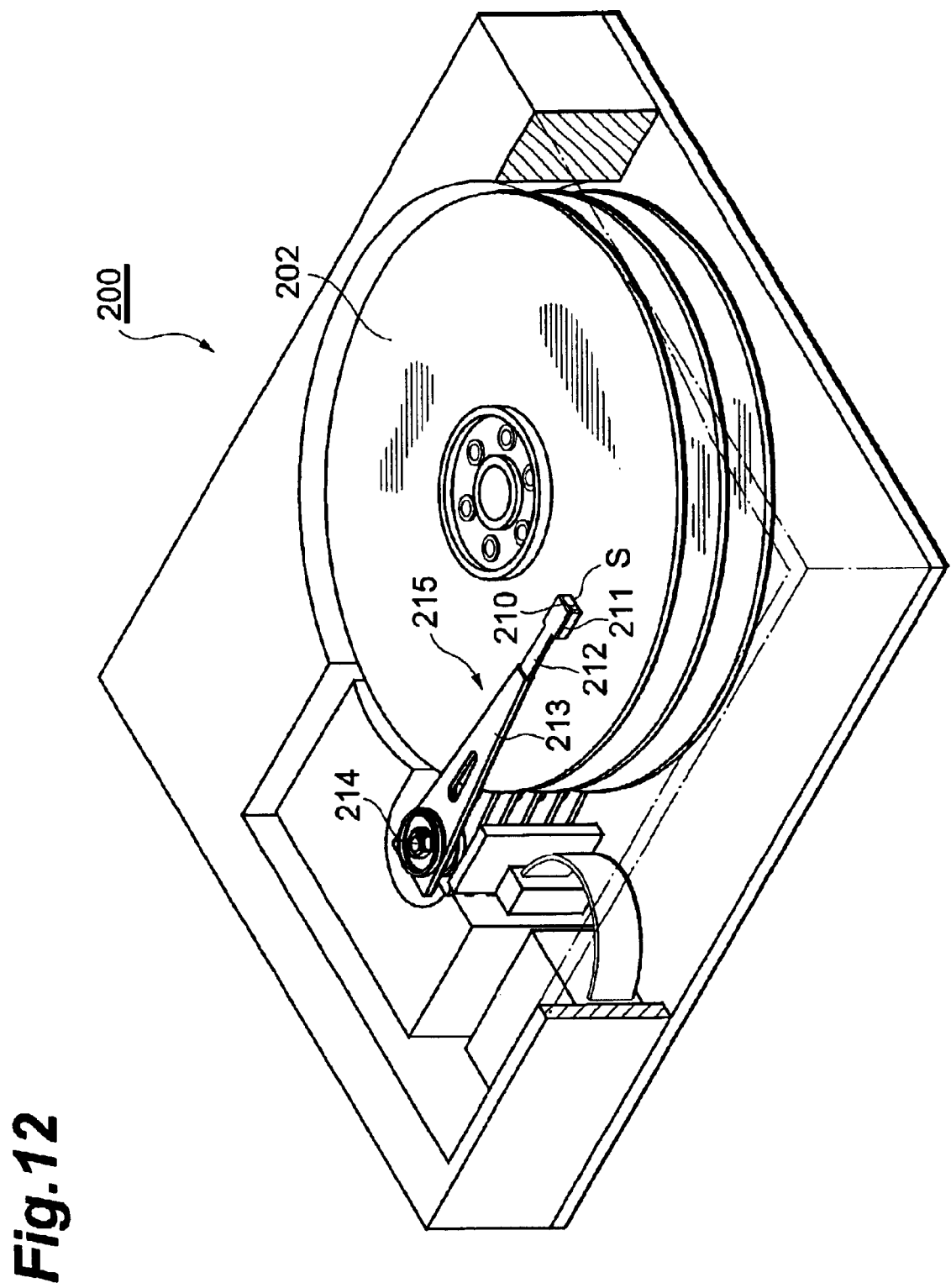
FIG. 12 is a perspective view showing a hard disk apparatus made by a second embodiment.

FIG. 12 is a view showing a hard disk apparatus (magnetic recording and reproducing apparatus) equipped with a thin-film magnetic head obtained by the making method in accordance with this embodiment. This hard disk apparatus 200 actuates a head arm assembly (HAA; magnetic head apparatus) 215, so as to cause a thin-film magnetic head 210 to record and reproduce magnetic information (magnetic signal) with respect to a recording surface (the upper face in FIG. 12) of a hard disk (magnetic recording medium) 202 rotating at a high speed. The head arm assembly 215 comprises gimbals (head supporting apparatus) 212 mounted with a slider (magnetic head slider) 211 formed with the thin-film magnetic head 210, and a suspension arm 213 connected thereto, while being rotatable about a shaft 214, for example, by a voice coil motor. When the head arm assembly 215 is rotated, the slider 211 moves radially of the hard disk 202, i.e., in a direction traversing track lines.

Figure 13:
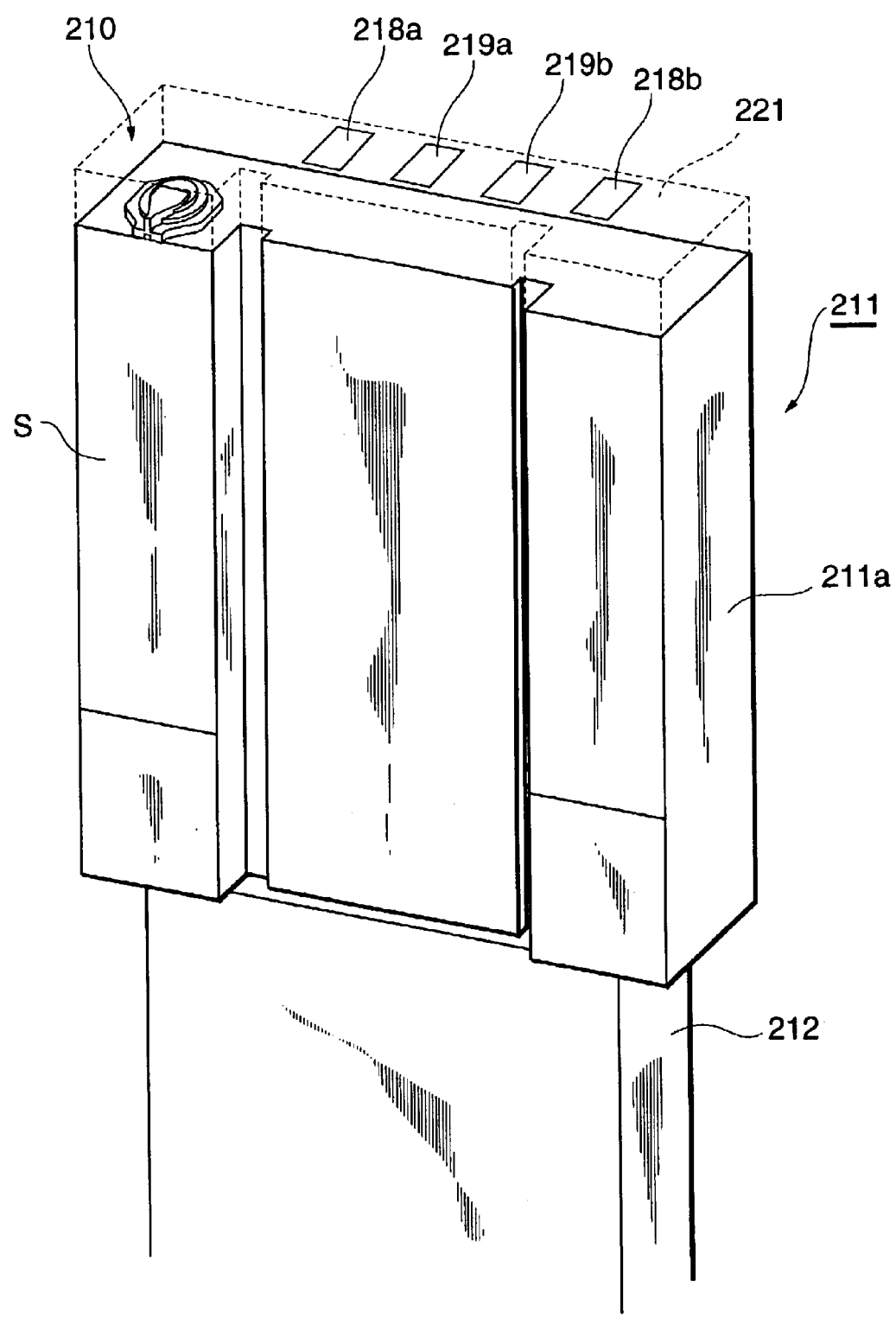
FIG. 13 is a perspective view showing a magnetic head slider in FIG. 12.

FIG. 13 is an enlarged perspective view of the slider 211. The slider 211 comprises a support 211a, made of AlTiC ($Al_2O_3 \cdot TiC$), having a substantially rectangular parallelepiped form, and the thin-film magnetic head 210 formed thereon. The surface on the front side in the drawing is a surface opposing the recording surface of the hard disk 202, and is referred to as an air bearing surface (ABS) S. When the hard disk 202 rotates, an airflow accompanying the rotation causes the slider 211 to float up, thereby separating the air bearing surface S from the recording surface of the hard disk 202. The thin-film magnetic head 210 is provided with recording terminals 218a, 218b and reproducing terminals 219a, 219b; whereas wires (not shown), connected to the terminals, for inputting and outputting electric signals are attached to the suspension arm 213 shown in FIG. 1. An overcoat layer 221 indicated by broken lines is provided in order to protect the thin-film magnetic head 210. The air bearing surface S may be coated with DLC (Diamond-Like Carbon) or the like.

Figure 14:
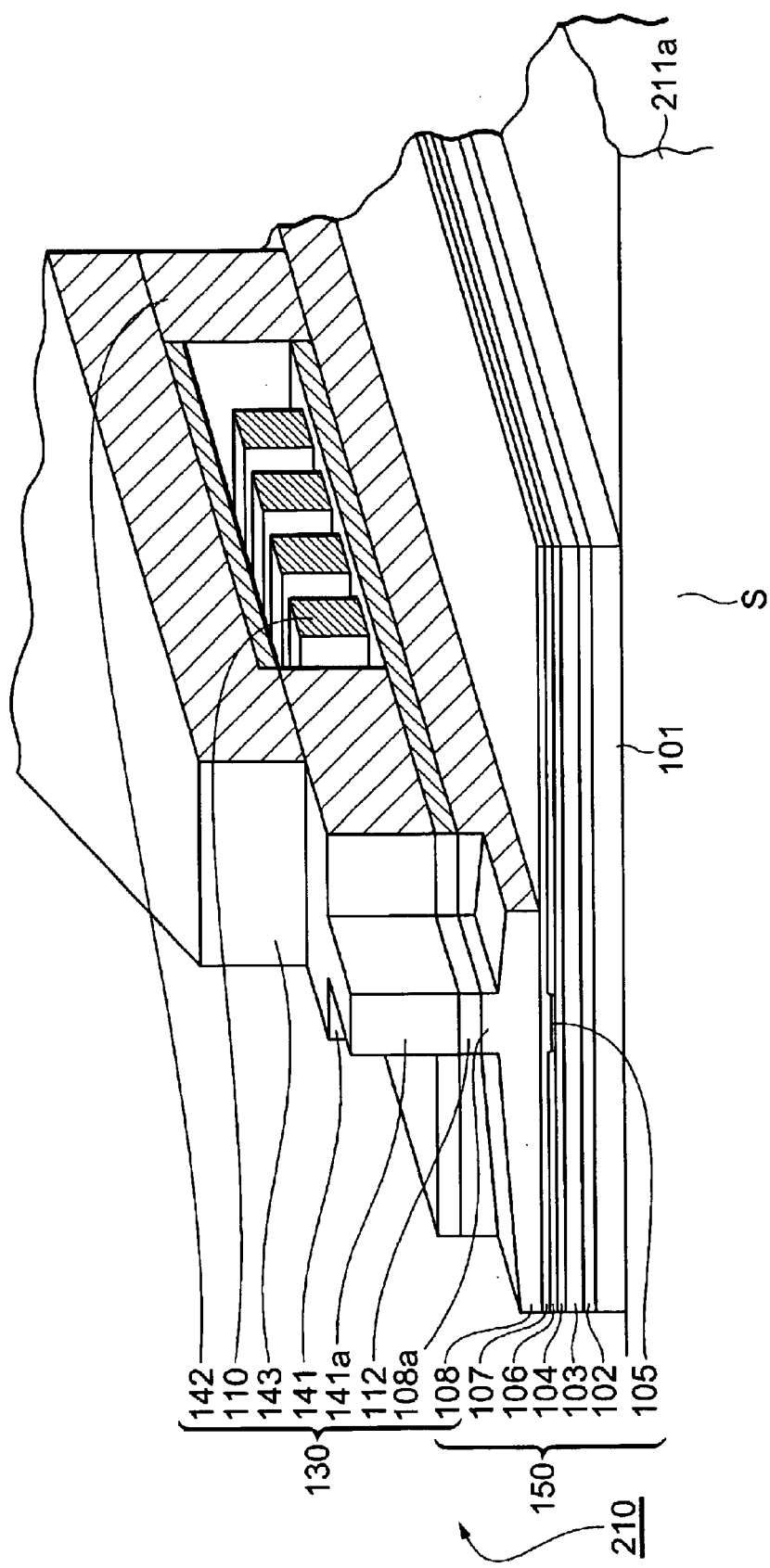
FIG. 14 is a partly cutaway perspective view of a magnetic head and its vicinity in FIG. 13.

FIG. 14 is an enlarged view schematically showing the thin-film magnetic head 210 formed with the slider 211. For explaining the outline of the thin-film magnetic head 210, it is partly cut away without showing the layers not mentioned.

The thin-film magnetic head 210 is a combination thin-film magnetic head in which a reproducing head section 150, formed on a substrate 101, having an MR device 105 as a magnetoresistive device, and a recording head section 130 as an induction type magnetic transducer are laminated.

The reproducing head section 150 mainly comprises a lower shield layer 103 disposed on an insulating layer 102 formed on the substrate 101, a lower shield gap film 104 disposed on the lower shield layer 103, an MR device 105 disposed on the lower shield gap film 104, electrode layers 106 disposed on both sides of the MR device 105, an upper shield gap film 107 formed on the MR device 105 and electrode layers 106, and an upper shield and lower magnetic pole layer (hereinafter referred to as lower magnetic pole layer) 108 disposed on the upper shield gap film 107.

Though not depicted, the electrode layers 106 are electrically connected to the reproducing terminals 219a and 219b (see FIG. 13), respectively. The words "upper" and "lower" used in the specification as in the shield layers refer to the sides farther from and closer to the substrate 101, respectively.

Such a reproducing head section 150 converts a change in magnetism of the hard disk 202 into a resistance value by using a magnetoresistive effect of the MR device 105, and reads out thus obtained resistance value by way of the reproducing terminals 219a, 219b, thereby reproducing information.

Referring to FIG. 14 again, the recording head section 130 of the thin-film magnetic head 210 will be explained. The recording head section 130 is disposed on the reproducing head section 150.

The recording head section 130 mainly comprises the lower magnetic pole layer 108 also acting as the upper shield of the reproducing head section 150, a recording gap layer 112 formed from an insulating material on the lower magnetic pole layer 108, an upper magnetic pole part layer 141 formed on the recording gap layer 112 on the air bearing surface S side, a magnetic layer 142 formed on the recording gap layer 112 at a position separated from the air bearing surface S, and a yoke part layer 143 formed so as to bridge the respective upper faces of the upper magnetic pole part layer 141 and magnetic layer 142.

The magnetic pole part layer 141 and the yoke part layer 143, and the yoke part layer 143 and the magnetic layer 142 are magnetically connected to each other, thus forming an upper magnetic pole layer (magnetic pole layer). On the other hand, the magnetic layer 142 and the lower magnetic pole layer 108 are magnetically connected to each other, whereby a magnetic path from the upper magnetic pole part layer 141 to the lower magnetic pole layer 108 is formed.

The recording head section 130 further comprises a thin-film coil 110 circulating about a part of the magnetic path, whereas a part of the thin-film coil 110 is disposed between the upper magnetic pole part layer 141 and the magnetic layer 142. The recording terminals 218a, 218b (see FIG. 13) are electrically connected to the thin-film coil 110.

The lower magnetic pole layer 108, upper magnetic pole part layer 141, and recording gap layer 112 are trimmed on the air bearing surface S side, so as to form a lower magnetic pole 108a and an upper magnetic pole 141a.

Such a recording head section 130 records information onto the hard disk 202 as follows. Namely, when a recording current is caused to flow through the thin-film coil 110 by way of the recording terminals 218a, 218b, a magnetic field occurs between the lower magnetic pole 108a and upper magnetic pole 141a acting as both ends of the closed magnetic path. Then, a magnetic flux occurring near the recording gap layer 112 magnetizes the hard disk 202, thereby recording the information.

The foregoing is the outline of the thin-film magnetic head 210, head gimbal assembly 215, and hard disk apparatus 200 obtained by the making method in accordance with this embodiment. Referring to FIGS. 14 to 27C, the method of making a thin-film magnetic head in accordance with this embodiment will now be explained.

The thin-film magnetic head 210 is made by the process in which, as shown in FIG. 14, a part corresponding to the reproducing head section 150 is prepared and then a part corresponding to the recording head section 130 is prepared. The pattern forming method of this embodiment is used when forming the upper magnetic pole part layer 141 and magnetic layer 142 of permalloy (NiFe) as the first magnetic pattern and the thin-film coil 110 of copper (Cu) as the second metal pattern on the same surface of the substrate 101 by frame plating.

FIGS. 15A to 27A (each suffixed with A) are sectional views of the thin-film magnetic head taken along a plane perpendicular to both the substrate 101 and air bearing surface S, whereas FIGS. 15B to 27B (each suffixed with B) are sectional views of the thin-film magnetic head taken along a plane parallel to the air bearing surface S near a magnetic pole. The number of turns of the thin-film coil 110, thickness of films, and the like are roughly depicted and are not always constant among the drawings.

In the method of making a thin-film magnetic head in accordance with this embodiment, as shown in FIGS. 15A and 15B, an insulating layer 102 made of alumina ($Al_2O_3$), for example, is initially deposited by a thickness of about 5 $\mu$m on a substrate 101 made of AlTiC ($Al_2O_3$.TiC), for example, and a lower shield layer 103, made of a magnetic material, e.g., permalloy, for the reproducing head section 150 is formed with a thickness of about 3 $\mu$m on the insulating layer 102.

The lower shield layer 103 is selectively formed on the insulating layer 102, for example, by plating while using a photoresist as a mask. Then, though not depicted, an insulating layer made of alumina is formed with a thickness of 4 to 5 $\mu$m all over, for example, and is polished, for example, by CMP (Chemical Mechanical Polishing) until the lower shield layer 103 is exposed, so that the surface is flattened.

Subsequently, as shown in FIGS. 16A and 16B, a lower shield gap film 104 as an insulating film is formed, for example, with a thickness of about 20 to 40 nm on the lower shield layer 103. Then, a reproducing MR device 105 is formed with a thickness of several tens of nanometers on the lower shield gap film 104 on the air bearing surface S side. The MR device 105 is formed, for example, by selectively etching an MR film formed by sputtering. Here, a device using a magnetosensitive film exhibiting a magnetoresistive effect such as an AMR device, a GMR device, or a TMR (tunneling magnetoresistive effect) device can be used for the MR device 105.

Thereafter, as shown in FIG. 16B, a pair of electrode layers 106 to be electrically connected to the MR device 105 are formed with a thickness of several tens of nanometers on both sides of the MR device 105 on the lower shield gap film 104. Further, as shown in FIGS. 16A and 16B, an upper shield gap film 107 as an insulating film is formed, for example, with a thickness of about 20 to 40 nm on the lower shield gap film 104 and MR device 105, whereby the MR device 105 is buried within the shield gap films 104, 107. Examples of the insulating material used for the shield gap films 104, 107 include alumina, aluminum nitride, and diamond-like carbon (DLC). The shield gap films 104, 107 may be formed by sputtering or chemical vapor deposition (CVD) using trimethyl ammonium ($Al(CH_3)_3$) and $H_2O$ or the like, for example. When CVD is used, thin, dense shield gap films 104, 107 with less pinholes can be formed.

Next, a lower magnetic pole layer 108 made of a magnetic material is selectively formed, for example, with a thickness of about 1.0 to 1.5 $\mu$m on the upper shield gap film 107 on the air bearing surface S side. The lower magnetic pole layer 108 is placed at a position opposing at least a part of a thin-film coil 110 which will be explained later. The lower magnetic pole layer 108 is used as the upper shield of the reproducing head section 150 and the lower magnetic pole layer of the recording head section 130.

Subsequently, an insulating layer 111 made of alumina, for example, is formed with a thickness of about 3 to 4 $\mu$m on the upper shield gap film 107 and lower magnetic pole layer 108, and is polished, for example, by CMP until the lower magnetic pole layer 108 is exposed, so that the surface is flattened.

Then, as shown in FIGS. 17A and 17B, a recording gap layer 112 made of an insulating material is formed, for example, with a thickness of 0.2 to 0.3 $\mu$m on the lower magnetic pole layer 108 and insulating layer 111. Thereafter, the recording gap layer 112 is partly etched at a part where a magnetic layer 142 is to be placed, so as to form a contact hole 113, in order to form a closed magnetic path.

Next, as shown in FIGS. 18A and 18B, a second electrode film 141S for forming the upper magnetic pole part layer 141 and magnetic layer 142 (see FIG. 22A) as the second metal pattern by frame plating, and a first electrode film 110S for forming the thin-film coil 110 (see FIG. 19A) as the first metal pattern by frame plating are successively formed as surface layers by sputtering in this embodiment. For example, permalloy (NiFe) is formed with a thickness of 50 nm as the second electrode film 141S, whereas copper (Cu) is formed with a thickness of 100 nm as the first electrode film 110S.

Subsequently, a photoresist 119 is applied onto the first electrode film 110S and then is patterned by a photolithography process, so as to form a first resist frame 119F which exposes the first electrode film 110S in conformity to the form of the thin-film coil 110.

Figures 19A, 19B:
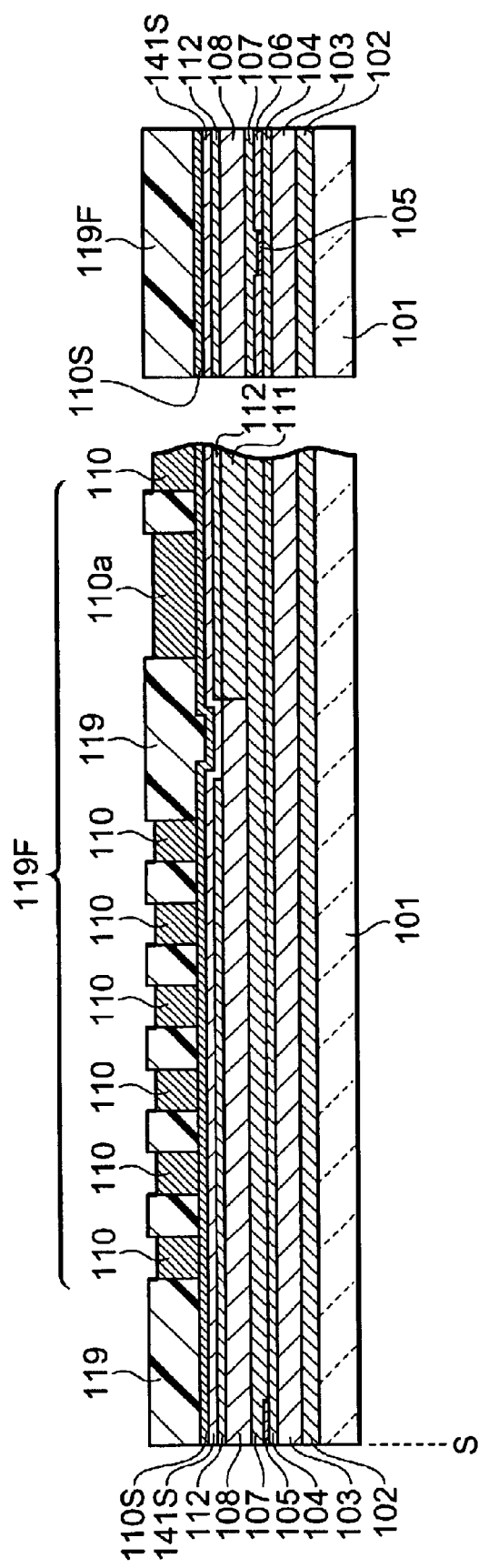
FIG. 19A is a view, taken along a plane perpendicular to both the substrate and air bearing surface, showing a state where a thin-film coil is plated on the first electrode film.
FIG. 19B is a sectional view, taken along a plane parallel to the air bearing surface near the magnetic pole, showing the state where the thin-film coil is plated on the first electrode film.

Thereafter, as shown in FIGS. 19A and 19B, the thin-film coil 110 made of copper (Cu), for example, is formed with a thickness of about 1.0 to 2.0 $\mu$m and a coil pitch of 0.3 to 2.0 $\mu$m, for example, by frame plating while using the first resist frame 119F with the first electrode film 110S acting as an electrode.

Next, as shown in FIGS. 20A and 20B, the first resist frame 119 is removed by an organic solvent or the like. In the drawings, reference 110a indicates a connecting part for connecting the thin-film coil 110 to an electrically conductive layer (lead) which will be explained later.

Subsequently, using the thin-film coil 110 as a mask, the first electrode film 110S is etched away by milling or the like. Here, the second electrode film 141S is left without etching, so as to be exposed at the surface.

Thereafter, as shown in FIGS. 21A and 21B, a photoresist 149 is applied so as to cover the surface of the second electrode film 141S, thin-film coil 110, and the like, and a second resist frame 149F exposing the second electrode film 141S in conformity to the form of the upper magnetic pole part layer 141 and magnetic layer 142 is formed by a photolithography step similar to that mentioned above. The form of the exposed part of the second resist form 149F on the upper magnetic pole part layer 141 side (air bearing surface S side) is tapered down toward the air bearing surface S.

Next, as shown in FIGS. 22A and 22B, permalloy (NiFe) or the like is plated, for example, with a thickness of about 1.5 to 2.5 μm on the second electrode film 141S by frame plating while using the second resist frame 149F with the second electrode film 141S acting as an electrode, so as to form the upper magnetic pole part layer 141 and magnetic layer 142. Here, the upper magnetic pole part layer 141 attains a trimmed form which is tapered down on the air bearing surface S side, whereby an upper magnetic pole 141a is formed at a tip on the air bearing surface S side.

For the upper magnetic pole part layer 141 and magnetic layer 142, NiFe (Ni: 80% by weight; Fe: 20% by weight), NiFe (Ni: 45% by weight; Fe: 55% by weight) acting as a high saturation flux density material, and the like can be used. Also, CoFe, CoFeNi, and the like which are high saturation flux density materials may be used. In this case, it is preferred that the second electrode film 141S be made of the same material as that of the upper magnetic pole part layer 141 and magnetic layer 142.

Figure 23B:
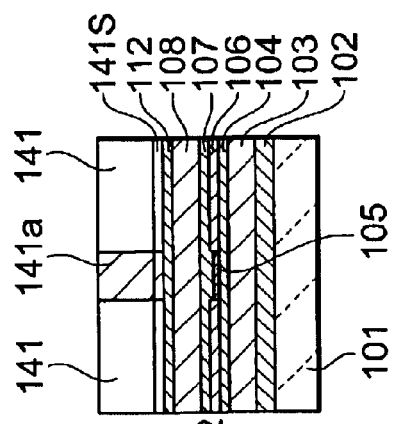
FIG. 23B is a sectional view, taken along a plane parallel to the air bearing surface near the magnetic pole, showing the state where the second resist frame is removed and the second electrode film is etched away while using the thin-film coil, upper magnetic pole layer, and magnetic layer as a mask.
Figure 23A:
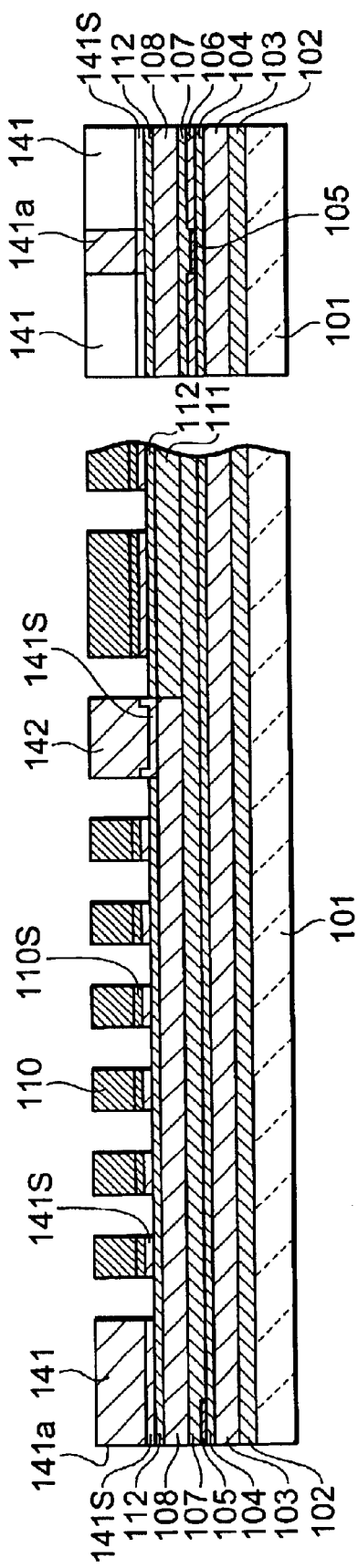
FIG. 23A is a view, taken along a plane perpendicular to both the substrate and air bearing surface, showing a state where the second resist frame is removed and the second electrode film is etched away while using the thin-film coil, upper magnetic pole layer, and magnetic layer as a mask.

Next, as shown in FIGS. 23A and 23B, the second resist frame 149F is removed by an organic solvent such as acetone. Then, using the upper magnetic pole part layer 141, magnetic layer 142, and thin-film coil 110 as a mask, the second electrode film 141S is etched away by milling.

Subsequently, a resist frame (not depicted) is formed on the part excluding the upper magnetic pole part layer 141. Using the trimmed upper magnetic pole part layer 141 and this resist frame as a mask, the recording gap layer 112 is selectively etched by dry etching as shown in FIGS. 24A and 24B. For this dry etching, reactive ion etching (RIE) using chlorine type gases such as $BCl_2$ and $Cl_2$ or fluorine type gases such as $CF_4$ and $SF_6$ is employed, for example. Further, a part of the lower magnetic pole layer 108 on the upper side is selectively etched by about 0.3 to 0.6 μm, for example, by argon ion milling. As a consequence, the upper magnetic pole part layer 141, recording gap layer 112, and lower magnetic pole layer 108 attain a trimmed form having a predetermined width on the air bearing surface S side, thereby forming a lower magnetic pole 108a. Thereafter, the previously formed resist frame is removed.

Next, as shown in FIGS. 25A and 25B, an insulating layer 135 made of alumina, for example, is formed with a thickness of about 3 to 4 μm all over. Subsequently, as shown in FIGS. 26A and 26B, the insulating layer 135 is polished, for example, by CMP until the upper magnetic pole part layer 141, magnetic layer 142, and thin-film coil 110 are exposed, so that the surface is flattened.

Thereafter, an insulating film 109 made of alumina, for example, is formed with a thickness of about 0.3 to 0.6 μm all over, and then the part of insulating film 109 on the upper magnetic pole part layer 141, magnetic layer 142, and coil connecting part 110a is etched away.

Next, a yoke part layer 143 made of a magnetic material is formed, for example, with a thickness of about 2 to 3 μm over the insulating film 109, upper magnetic pole layer 141, and magnetic layer 142. The yoke part layer 143 is in contact with the lower magnetic pole layer 108 by way of the magnetic layer 142, while in contact with the upper magnetic pole part layer 141, whereby they are magnetically connected to each other so as to form a closed magnetic path. The yoke part layer 143 may be formed by plating while using NiFe (Ni: 80% by weight; Fe: 20% by weight), NiFe (Ni: 45% by weight; Fe: 55% by weight) acting as a high saturation flux density material, and the like, or by sputtering. Also, CoFe, Co type amorphous materials, and the like which are high saturation flux density materials may be used. For improving high-frequency characteristics, the yoke part layer 143 of the upper magnetic pole layer may have a structure in which a number of inorganic insulating films and magnetic layers made of permalloy or the like are overlaid on one another. In this embodiment, the end face of the yoke part layer 143 on the air bearing surface S side is disposed at a position (on the right side of FIG. 26A) separated from the air bearing surface S.

Subsequently, as shown in FIGS. 27A and 27C, a routing lead 144, made of an electrically conductive metal such as Cu, for connecting the coil connecting part 110a to a takeout electrode is formed by frame plating or the like. Also, as shown in FIGS. 27A and 27B, an overcoat layer 137 made of alumina, for example, is formed with a thickness of 20 to 40 μm all over, and its surface is flattened, so that an electrode terminal, which is not depicted, is formed thereon. Finally, the slider is polished, so as to form the air bearing surface S of the recording head section 130 and reproducing head section 150, whereby the thin-film magnetic head 210 of this embodiment is accomplished.

FIG. 27C is a top plan view of the thin-film magnetic head 210, which omits the overcoat layer 137 and other insulating layers and insulating films. In FIG. 27C, TH indicates throw height, TH0 the throw height zero position, and MR-H the MR height. Here, the MR height refers to the length (height) from the end part of MR device 105 on the air bearing surface S side to the opposite side.

This embodiment employs a pattern forming process similar to that of the first embodiment, whereby a pattern of the upper magnetic pole part layer 141, magnetic layer 142, and thin-film coil 110 having a high adhesion and a high impurity as mentioned above can be obtained. As a consequence, the thin-film coil 110 attains a sufficiently small specific resistance, whereas the upper magnetic pole part layer 141 and magnetic layer 142 exhibit sufficiently high soft magnetic characteristics and saturation flux densities, whereby the recording head section 130 of the thin-film magnetic head 210 can achieve higher performance and higher reliability. Also, performances of the slider 211, head arm assembly 215, and hard disk apparatus 200 equipped with such a thin-film magnetic head 210 can be enhanced, whereby their reliability improves.

Without being restricted to the above-mentioned embodiments, the present invention can be modified in various manners.

For example, though patterns are formed from two kinds of metal materials different from each other on the same surface of a substrate, three or more kinds of patterns may be formed from three or more kinds of metal materials different from one another. In this case, it will be sufficient if respective electrode films corresponding to these three or more kinds of metal materials are laminated on the substrate in an electrode film laminating step, and metal patterns are successively formed from those corresponding to the electrode films on the upper side. Here, the metal materials are not restricted to copper and permalloy as a matter of course.

Though each metal material and its corresponding electrode film are made of the same material in the above-mentioned embodiments in order to enhance adhesion and the like and prevent contamination with plating solutions and the like from occurring, different kinds of materials may be combined when there are no problems of contamination with the plating solution and the like. For example, a combination in which a nickel electrode film is plated with copper by a copper sulfate bath and the like are favorable.

Though a resist frame is formed on an electrode film by utilizing a photoresist in the second embodiment, other resists such as electron beam resist and X-ray resist may be used as well.

Though a thin-film magnetic head is made as a microdevice in the second embodiment, it is not restrictive. The present invention is applicable to the making of microdevices such as thin-film inductors, semiconductor devices, thin-film sensors, and thin-film actuators, and apparatus including them. That is, the present invention is applicable to the making of any microdevice in which patterns made of respective metal materials different from each other are formed on the same surface of a substrate, and apparatus including the same.

In the present invention, as mentioned above, all the electrode films corresponding to respective metal materials are laminated on a substrate beforehand. Then, after the first metal pattern is formed by plating the first electrode film with a metal material suitable for the first electrode film, the first electrode film is etched away, whereby the second electrode film located closer to the substrate than is the first electrode film is exposed at the surface. Therefore, the second electrode film suitable for the metal material of the second metal pattern can selectively be plated, whereby the combination of each metal material and each electrode film can be optimized. Hence, the film quality of the plated metal pattern improves, so that the adhesion between the plated metal pattern and the electrode film can be enhanced.

Also, since all the electrode films are laminated on the substrate before forming metal patterns, it is unnecessary for an electrode film for the next metal pattern to be formed on the substrate after one metal pattern is formed. Therefore, the electrode film for the next metal pattern does not attach to a metal pattern which has already been formed, whereby favorable metal patterns to which impurities attach less can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 2002-124454 filed on Apr. 25, 2002 is hereby incorporated by reference.

What is claimed is:

1. A pattern forming method for forming a plurality of metal patterns made of respective metal materials different from each other on the same surface of a substrate, said method comprising:

an electrode film laminating step of laminating a plurality of electrode films corresponding to said respective metal materials on said substrate;

a first pattern forming step of forming a first resist frame on a first electrode film located farthest from said substrate in said plurality of electrode films so as to expose a predetermined part of said first electrode film therethrough, plating said exposed part of said first electrode film with a metal material corresponding to said first electrode film so as to form a first metal pattern, and removing said first resist frame;

a first electrode film removing step of etching said first electrode film away while using said first metal pattern as a mask so as to expose a second electrode film closer to said substrate than is said first electrode film; and a second pattern forming step of forming a second resist frame on said second electrode film so as to expose a predetermined part of said second electrode film therethrough, and plating said exposed part of said second electrode film with a metal material corresponding to said second electrode film so as to form a second metal pattern.

2. A pattern forming method according to claim 1, wherein each of said metal materials and an electrode film corresponding to said metal material are made of the same material.

3. A method of making a microdevice formed with a plurality of metal patterns made of respective metal materials different from each other on the same surface of a substrate, said method comprising:

an electrode film laminating step of laminating a plurality of electrode films corresponding to said respective metal materials on said substrate;

a first pattern forming step of forming a first resist frame on a first electrode film located farthest from said substrate in said plurality of electrode films so as to expose a predetermined part of said first electrode film therethrough, plating said exposed part of said first electrode film with a metal material corresponding to said first electrode film so as to form a first metal pattern, and removing said first resist frame;

a first electrode film removing step of etching said first electrode film away while using said first metal pattern as a mask so as to expose a second electrode film closer to said substrate than is said first electrode film; and a second pattern forming step of forming a second resist frame on said second electrode film so as to expose a predetermined part of said second electrode film therethrough, and plating said exposed part of said second electrode film with a metal material corresponding to said second electrode film so as to form a second metal pattern.

4. A method of making a microdevice according to claim 3, wherein each of said metal materials and an electrode film corresponding to said metal material are made of the same material.

5. A method of making a thin-film magnetic head formed with a plurality of metal patterns made of respective metal materials different from each other on the same surface of a substrate, said method comprising:

an electrode film laminating step of laminating a plurality of electrode films corresponding to said respective metal materials on said substrate;

a first pattern forming step of forming a first resist frame on a first electrode film located farthest from said substrate in said plurality of electrode films so as to expose a predetermined part of said first electrode film therethrough, plating said exposed part of said first electrode film with a metal material corresponding to said first electrode film so as to form a first metal pattern, and removing said first resist frame;

a first electrode film removing step of etching said first electrode film away while using said first metal pattern as a mask so as to expose a second electrode film closer to said substrate than is said first electrode film; and a second pattern forming step of forming a second resist frame on said second electrode film so as to expose a predetermined part of said second electrode film therethrough, and plating said exposed part of said second electrode film with a metal material corresponding to said second electrode film so as to form a second metal pattern.

6. A method of making a thin-film magnetic head according to claim 5, wherein each of said metal materials and an electrode film corresponding to said metal material are made of the same material.

7. A method of making a thin-film magnetic head according to claim 5, wherein said thin-film magnetic head comprises a thin-film coil and a magnetic pole layer which are made of respective metal materials different from each other, said thin-film coil and said magnetic pole layer being formed as said metal patterns.

8. A method of making a magnetic head slider comprising a thin-film magnetic head, said method comprising the step of making said thin-film magnetic head by using the method according to claim 5.

9. A method of making a magnetic head apparatus including a thin-film magnetic head and a head supporting apparatus for supporting said thin-film magnetic head, said method comprising the step of making said thin-film magnetic head by using the method according to claim 5.

10. A method of making a magnetic recording and reproducing apparatus comprising a magnetic head apparatus including a thin-film magnetic head and a head supporting apparatus for supporting said thin-film magnetic head, and a magnetic recording medium for carrying out magnetic recording and reproducing in cooperation with said thin-film magnetic head, said method comprising the step of making said magnetic head apparatus by using the method according to claim 9.

* * * * *